(12) United States Patent
Ishida et al.

(10) Patent No.: US 11,028,340 B2
(45) Date of Patent: Jun. 8, 2021

(54) COMPOSITION FOR SURFACE TREATMENT, METHOD FOR PRODUCING THE SAME, SURFACE TREATMENT METHOD USING COMPOSITION FOR SURFACE TREATMENT, AND METHOD FOR PRODUCING SEMICONDUCTOR SUBSTRATE

(71) Applicant: FUJIMI INCORPORATED, Kiyosu (JP)

(72) Inventors: Yasuto Ishida, Kiyosu (JP); Tsutomu Yoshino, Kiyosu (JP); Shogo Onishi, Kiyosu (JP); Yukinobu Yoshizaki, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/491,349

(22) PCT Filed: Feb. 19, 2018

(86) PCT No.: PCT/JP2018/005779
§ 371 (c)(1),
(2) Date: Sep. 5, 2019

(87) PCT Pub. No.: WO2018/163781
PCT Pub. Date: Sep. 13, 2018

(65) Prior Publication Data
US 2020/0024547 A1    Jan. 23, 2020

(30) Foreign Application Priority Data

Mar. 6, 2017 (JP) .............................. JP2017-042112
Sep. 26, 2017 (JP) .............................. JP2017-185150

(51) Int. Cl.
| | | |
|---|---|---|
| C11D 3/37 | (2006.01) | |
| C11D 1/00 | (2006.01) | |
| C09G 1/04 | (2006.01) | |
| C11D 11/00 | (2006.01) | |
| C11D 17/00 | (2006.01) | |
| H01L 21/02 | (2006.01) | |
| H01L 21/306 | (2006.01) | |

(52) U.S. Cl.
CPC ............... *C11D 1/008* (2013.01); *C09G 1/04* (2013.01); *C11D 3/3753* (2013.01); *C11D 11/0047* (2013.01); *C11D 17/0008* (2013.01); *H01L 21/02057* (2013.01); *H01L 21/30625* (2013.01)

(58) Field of Classification Search
CPC .................................................. C11D 11/0047
USPC ....................................................... 510/175
See application file for complete search history.

(56) References Cited

U.S. PATENT DOCUMENTS

| | | |
|---|---|---|
| 2006/0035797 A1 | 2/2006 | Tomita |
| 2007/0167343 A1* | 7/2007 | Suzuki ................ C11D 1/345 510/329 |
| 2013/0174867 A1 | 7/2013 | Harada |
| 2013/0183826 A1 | 7/2013 | Tsuchiya |
| 2015/0132955 A1 | 5/2015 | Yamato |

FOREIGN PATENT DOCUMENTS

| | | |
|---|---|---|
| JP | 2006-080501 A | 3/2006 |
| JP | 2012-074678 A | 4/2012 |
| JP | 2013-243208 A | 12/2013 |
| WO | WO-2012/039390 A1 | 3/2012 |

* cited by examiner

Primary Examiner — Gregory E Webb
(74) Attorney, Agent, or Firm — Foley & Lardner LLP

(57) ABSTRACT

An objective of the present invention is to provide a means for sufficiently removing residues remaining on a surface of a polished object to be polished.
A composition for surface treatment containing a polymer compound having at least one ionic functional group selected from the group consisting of a sulfonic acid (salt) group, a phosphoric acid (salt) group, a phosphoric acid (salt) group, and an amino group, and water, in which pH is less than 7, and the polymer compound has a pKa of 3 or less and an ionic functional group density of more than 10%.

21 Claims, No Drawings

COMPOSITION FOR SURFACE TREATMENT, METHOD FOR PRODUCING THE SAME, SURFACE TREATMENT METHOD USING COMPOSITION FOR SURFACE TREATMENT, AND METHOD FOR PRODUCING SEMICONDUCTOR SUBSTRATE

TECHNICAL FIELD

The present invention relates to a composition for surface treatment, a method for producing the same, a surface treatment method using the composition for surface treatment, and a method for producing a semiconductor substrate.

BACKGROUND ART

In recent years, in accordance with multilayer wiring on a surface of a semiconductor substrate, a so-called chemical mechanical polishing (CMP) technique which physically polishes and flattens a semiconductor substrate in producing a device has been used. CMP is a method for flattening a surface of an object to be polished (object to be polished) such as a semiconductor substrate, using a polishing composition (slurry) containing abrasive grains such as silica, alumina, or ceria, an anti-corrosive, a surfactant, and the like, and the object to be polished (object to be polished) is silicon, polysilicon, silicon oxide, silicon nitride, a wiring, a plug formed of metal or the like, or the like.

A large amount of impurities (also referred to as foreign matters or defects) remains on the surface of the semiconductor substrate after a CMP step. The impurities include abrasive grains derived from a polishing composition used for CMP, metals, anti-corrosives, and organic substances such as surfactants, silicon-containing materials which are objects to be polished, silicon-containing materials or metals generated by polishing a metal wiring, plug, or the like, and organic substances such as pad debris generated from various pads and the like.

Contamination of the surface of the semiconductor substrate with these impurities can adversely affect electrical properties of the semiconductor and reduce device reliability. Therefore, it is desirable to introduce a cleaning step after the CMP step to remove these impurities from the surface of the semiconductor substrate.

As such a cleaning composition, for example, in JP 2012-74678 A (corresponding to US 2013/174867 A), a cleaning composition for a semiconductor substrate containing a polycarboxylic acid or a hydroxycarboxylic acid, a sulfonic acid-type anionic surfactant, a carboxylic acid-type anionic surfactant and water is disclosed, and it is disclosed that it is possible to remove foreign matters by the cleaning composition without corroding the substrate surface.

SUMMARY OF INVENTION

However, the technique disclosed in JP 2012-74678 A had an problem that foreign matters (residues) could not be sufficiently removed in the cleaning of the polished object to be polished.

Therefore, the present inventors have examined a relationship between the type of the polished object to be polished and the type of the foreign matters. As a result, the present inventors have found that residues easily adhere to the semiconductor substrate, and such organic residues may cause destruction of a semiconductor device.

The present invention has been made in view of the above problem, and an objective of the present invention is to provide a means to sufficiently remove residues remaining on a surface of the polished object to be polished.

The present inventors have conducted an intensive investigation in view of the above problem. As a result, the present inventors have found that a composition for surface treatment having pKa and ionic functional group density in specific ranges and containing a polymer compound having at least one ionic functional group selected from the group consisting of a sulfonic acid (salt) group, a phosphoric acid (salt) group, a phosphoric acid (salt) group, and an amino group remarkably improves an effect of removing residues on the surface of the polished object to be polished, and completed the present invention.

That is, the present invention is a composition for surface treatment containing a polymer compound having at least one ionic functional group selected from the group consisting of a sulfonic acid (salt) group, a phosphoric acid (salt) group, a phosphoric acid (salt) group, and an amino group, and water, in which the pH value is less than 7, and the polymer compound has a pKa of 3 or less and an ionic functional group density represented by the following formula (1):

[Mathematical Formula 1]

$$\text{Ionic functional group density (\%)} = 100 \times (\text{Number of constituent unit derived from monomer having ionic functional group/Number of constituent unit derived from all monomers constituting polymer compound}) \quad \text{Formula (1)}$$

of more than 10%.

DESCRIPTION OF EMBODIMENTS

Hereinafter, the present invention will be described. Here, the present invention is not limited only to the following embodiments.

In the present specification, the "from X to Y" indicating the range means "X or more and Y or less". Also, in the present specification, unless otherwise specified, the operation and the measurement of physical properties and the like are carried out under the conditions of room temperature (20 to 25° C.)/relative humidity 40 to 50% RH. Further, in the present specification, the description "(meth)acrylic" in specific names of the compounds represents "acrylic" and "methacrylic", and "(meth)acrylate" represents "acrylate" and "methacrylate".

Further, in the present specification, a polymer compound having at least one ionic functional group selected from the group consisting of a sulfonic acid (salt) group, a phosphoric acid (salt) group, a phosphonic acid (salt) group, and an amino group is also simply referred to as an "ionic functional group-containing polymer". Among them, a polymer compound having at least one acid functional group selected from the group consisting of a sulfonic acid (salt) group, a phosphoric acid (salt) group, and a phosphonic acid (salt) group is also referred to as an "acid functional group-containing polymer P". Furthermore, a polymer compound having a sulfonic acid (salt) group is also simply referred to as a "sulfonic acid (salt) group-containing polymer", a polymer compound having a phosphoric acid (salt) group is also simply referred to as a "phosphoric acid (salt) group-containing polymer", a polymer compound having a phosphonic acid (salt) group is also simply referred to as a "phosphonic acid (salt) group-containing polymer", and a polymer compound having an amino group is also simply referred to as an "amino group-containing polymer".

<Residue>

The composition for surface treatment according to an embodiment of the present invention shows an excellent removing effect of residues adhered to the surface of the polished object to be polished (hereinafter also referred to as an "object to be subjected to surface treatment" or an "object to be cleaned").

In the present specification, the residue represents a foreign matter attached to the surface of the polished object to be polished. The residue is not particularly limited, and examples include organic residues described later, particle residues derived from abrasive grains contained in the polishing composition, residues consisting of components other than the particle residues and the organic residues, other residues such as mixtures of the particle residues and the organic residues, and the like.

A total number of residues represents a total number of all residues regardless of the type. The total number of residues can be measured using a wafer defect inspection system. The details of the method of measuring the number of residues are described in the following examples.

In the present specification, the organic residue represents a component consisting of an organic substance such as an organic low molecular weight compound, a polymer compound, or the like, or an organic salt, among foreign matters adhered to the surface of the polished object to be polished (object to be subjected to surface treatment).

Examples of the organic residues adhering to the object to be subjected to surface treatment include pad debris generated from a pad used in the following polishing step or a rinse polishing step which may optionally be provided, or components derived from additives contained in a polishing composition used in the polishing step or a rinse polishing composition used in the rinse polishing step, and the like.

In addition, since color and shape of the organic residues and other foreign matters are significantly different, whether or not the foreign matters are organic residues can be visually determined by SEM observation. The determination as to whether or not the foreign matters are organic residues may be determined using element analysis by an energy dispersive X-ray analyzer (EDX), as necessary.

The number of organic residues can be measured using a wafer defect inspection system and SEM or EDX elemental analysis. The details of the method of measuring the number of organic residues are described in the following examples.

<Polished Object to be Polished>

In the present specification, the polished object to be polished means an object to be polished after being polished in the polishing step. The polishing step is not particularly limited, but is preferably a CMP step.

The composition for surface treatment according to an embodiment of the present invention is preferably used to reduce residues remaining on the surface of a polished object to be polished containing at least one selected from the group consisting of silicon nitride, silicon oxide and polysilicon. That is, in an embodiment of the present invention, the polished object to be polished preferably contains at least one selected from the group consisting of silicon nitride, silicon oxide and polysilicon. Examples of the polished object to be polished containing silicon oxide include a TEOS-type silicon oxide surface (hereinafter, also simply referred to as "TEOS") produced using tetraethyl orthosilicate as a precursor, an HDP film, a USG film, a PSG film, a BPSG film, an RTO film, and the like.

The polished object to be polished is preferably a polished semiconductor substrate, and more preferably a semiconductor substrate after CMP. The reason is that the residue may cause destruction of the semiconductor device, so that when the polished object to be polished is a polished semiconductor substrate, it is required to remove the residue as much as possible in the cleaning step of the semiconductor substrate.

The polished object to be polished containing silicon nitride, silicon oxide or polysilicon is not particularly limited, and examples include polished objects to be polished consisting of each simple substance of silicon nitride, silicon oxide and polysilicon, polished objects to be polished in a state where materials other than these materials are exposed on the surface, in addition to silicon nitride, silicon oxide or polysilicon, and the like. Here, examples of the former include a silicon nitride substrate, a silicon oxide substrate or a polysilicon substrate which is a semiconductor substrate. Moreover, regarding the latter, in addition to silicon nitride, silicon oxide or polysilicon, examples include substrates in which other materials such as tungsten are exposed on the surface, and the like. Further specific examples of the polished objects to be polished include a polished semiconductor substrate having a structure in which a silicon nitride film or a silicon oxide film is formed on tungsten, a polished semiconductor substrate having a structure in which a tungsten portion, a silicon nitride film and a silicon oxide film are all exposed, and the like.

Here, the composition for surface treatment according to an embodiment of the present invention has a high removing effect regardless of the type of residue, but particularly shows an extremely high removing effect of residues derived from organic substances (organic foreign matters, organic residues), so that it is preferable to be used to reduce organic residues.

In addition, from the viewpoint of the effects exhibited by the present invention, the composition for surface treatment according to an embodiment of the present invention is preferably used to reduce organic residues on the surface of a polished object to be polished containing silicon nitride or silicon oxide, and more preferably used to reduce organic residues on the surface of the polished object to be polished containing silicon nitride. The reason is that the effect of removing organic residues by an action of removing the organic residues described later is presumed to be stronger than the effect of removing organic residues by a re-adhesion inhibiting action of the organic residues described later, and further that a positive charge of silicon nitride under acidic conditions described later is presumed to be stronger than a positive charge of silicon oxide, and the effect of removing organic residues by an ionic functional group-containing polymer becomes stronger. Moreover, organic residues are particularly preferable as residues to be removed in these polished objects to be polished. This is because the present invention exhibits an extremely remarkable effect for organic residues.

<Composition for Surface Treatment>

The composition for surface treatment according to an embodiment of the present invention contains a polymer compound having at least one ionic functional group selected from the group consisting of a sulfonic acid (salt) group, a phosphoric acid (salt) group, a phosphoric acid (salt) group, and an amino group, and water, in which pH is less than 7, and the polymer compound has a pKa of 3 or less and an ionic functional group density represented by the following formula (1):

[Mathematical Formula 2]

Ionic functional group density (%)=100×(Number of constituent unit derived from monomer having ionic functional group/Number of constituent unit derived from all monomers constituting polymer compound)  Formula (1)

of more than 10%. The composition for surface treatment according to an embodiment of the present invention is preferably used to reduce the residues on the surface of the polished object to be polished. In addition, according to an embodiment of the present invention, there is provided a means capable of sufficiently removing the residues remaining on the surface of the polished object to be polished.

The composition for surface treatment according to an embodiment of the present invention is particularly preferably used as an organic residue reducing agent for selectively removing organic residues in the cleaning step.

The present inventors estimate a mechanism by which the above issue is solved by the present invention as follows.

As a result of chemical interaction between each component contained in the composition for surface treatment, and a surface of the object to be subjected to surface treatment and foreign matters, the composition for surface treatment has a function of removing or facilitating removal of foreign matters on the surface of the object to be subjected to surface treatment.

Here, as the residue adhering to the object to be subjected to surface treatment, there are a component which is likely to be positively charged under acidic conditions (hereinafter, also referred to as a "positively chargeable component") and a hydrophobic component which is unlikely to be positively charged under acidic conditions (hereinafter also referred to as "hydrophobic component"), which need to be respectively removed by separate mechanisms.

Hereinbelow, a case of an acid functional group-containing polymer in which the ionic functional group is an acid functional group is shown as an example of the present invention. However, the present invention is not limited thereto, and exhibits a good residue removing effect even when using a basic functional group-containing polymer in which the ionic functional group is a basic functional group.

For example, when the object to be subjected to surface treatment contains silicon nitride or silicon oxide, a silicon nitride portion or a silicon oxide portion of the surface of the object to be subjected to surface treatment is positively charged, under acidic conditions. As a result, a part of the anionized acid functional groups of the acid functional group-containing polymer is directed to the surface side of the object to be subjected to surface treatment, and an anionized acid functional group other than the part of the anionized acid functional groups is directed to the opposite side to the surface side of the object to be subjected to surface treatment, whereby the acid functional group-containing polymer is electrostatically adsorbed to the object to be subjected to surface treatment. Further, among the residues, the positively chargeable component is positively charged, generally under acidic conditions. As a result, a part of the anionized acid functional groups of the acid functional group-containing polymer is directed to the positively chargeable component side, and an anionized acid functional group other than the part of the anionized acid functional groups is directed to the opposite side to the surface side of the positively chargeable component, whereby the acid functional group-containing polymer is electrostatically adsorbed to the surface of the positively chargeable component. At this time, the object to be subjected to surface treatment becomes a state of being negatively charged as being covered with the anionized acid functional groups directing to the opposite side to the surface side of the object to be subjected to surface treatment, and the positively chargeable component becomes a state of being negatively charged as being covered with the anionized acid functional groups directing to the opposite side to the surface side of the positively chargeable component. Then, the surface of the object to be subjected to surface treatment covered with the anionized acid functional groups and the positively chargeable component covered with the anionized acid functional groups are electrostatically repelled, whereby the positively chargeable component is removed from the surface of the object to be subjected to surface treatment. Meanwhile, with respect to the hydrophobic component, a hydrophobic structural site of the acid functional group-containing polymer is directed to the surface side of the hydrophobic component, and the anionized acid functional group which is a hydrophilic structural site is directed to the opposite side to the surface side of the hydrophobic component, whereby the acid functional group-containing polymer is adsorbed to the surface of the hydrophobic component by hydrophobic interaction. At this time, the hydrophobic component forms micelles covered with the anionized acid functional groups directing to the opposite side to the surface side of the hydrophobic component. Then, the micelles are dissolved or dispersed in the composition for surface treatment, whereby the hydrophobic component is removed from the surface of the object to be subjected to surface treatment. Moreover, the acid functional group-containing polymer adsorbed on the surface of the object to be subjected to surface treatment is easily removed after the surface treatment step.

For example, when the object to be subjected to surface treatment includes polysilicon, a polysilicon portion on the surface of the object to be subjected to surface treatment is not positively charged under acidic conditions, so that the residues are removed by a mechanism different from the case where the object to be subjected to surface treatment contains silicon nitride or silicon oxide. Since polysilicon is hydrophobic, the hydrophobic component is in a state of being easily adhered to the surface of the object to be subjected to surface treatment by hydrophobic interaction, so that re-adhesion of the hydrophobic component once removed from the surface of the object to be subjected to surface treatment occurs in the surface treatment step. Here, the hydrophobic structural site of the sulfonic acid (salt) group-containing polymer is directed to the surface side of the object to be subjected to surface treatment, and the anionized acid functional group which is a hydrophilic structural site is directed to the opposite side of the surface side of the object to be subjected to surface treatment, thereby adsorbing to the surface of the object to be subjected to surface treatment by hydrophobic interaction. As a result, the object to be subjected to surface treatment becomes hydrophilic as being covered with the anionized acid functional group directing to the opposite side to the surface side of the object to be subjected to surface treatment, and hydrophobic interaction does not occur between the surface of the object to be subjected to surface treatment and the hydrophobic component. Thereby, the hydrophobic component is prevented from re-adhering to the surface of the object to be subjected to surface treatment. In addition, with regard to the positively chargeable component, as in the case where the object to be subjected to surface treatment contains silicon nitride or silicon oxide, the surface of the object to be subjected to surface treatment covered with the anionized acid functional groups and the positively chargeable component covered with the anionized acid functional groups are electrostatically repelled, under acidic conditions, whereby the positively chargeable component is removed from the surface of the object to be subjected to surface treatment. Moreover, the acid functional group-containing polymer adsorbed on the surface of the object to be subjected to surface treatment is easily removed after the surface treatment step.

Thus, the composition for surface treatment according to an embodiment of the present invention removes residues well because the acid functional group-containing polymer functions to remove both the positively chargeable component and the hydrophobic component. Then, by setting the pKa value of the acid functional group-containing polymer and the acid functional group density to specific ranges, the effect of removing residues is further improved.

The detailed reason why residues derived from a polishing composition and various pads could not be sufficiently removed by the technique of JP 2012-74678 A is unknown in detail, but it is considered that it is because the specifically disclosed compound having a sulfonic acid (salt) group is a low molecular weight compound, and the low molecular weight compound having a sulfonic acid (salt) group cannot obtain good covering properties to the surface of the object to be subjected to surface treatment or the surface of the positively chargeable component, suitable electrostatic repulsive force for removing residues, and good removability of the acid functional group-containing polymer after the surface treatment step, and the like, like the acid functional group-containing polymer according to the present invention.

The above mechanism is based on a presumption, and whether it is correct or incorrect has no influence on the technical scope of the present invention.

Hereinafter, each component contained in the composition for surface treatment according to an embodiment of the present invention will be described.

[Ionic Functional Group-Containing Polymer]

The composition for surface treatment according to an embodiment of the present invention essentially contains a polymer compound having at least one ionic functional group selected from the group consisting of a sulfonic acid (salt) group, a phosphoric acid (salt) group, a phosphonic acid (salt) group, and an amino group (ionic functional group-containing polymer). The polymer compound contributes to removal of residues by the composition for surface treatment.

A preferable example according to an embodiment of the present invention includes that the ionic functional group-containing polymer contains a homopolymer consisting of only a constituent unit having at least one acid functional group selected from the group consisting of a sulfonic acid (salt) group, a phosphoric acid (salt) group and a phosphonic acid (salt) group (hereinafter, also simply referred to as "homopolymer D"). However, the present invention is not limited thereto.

The composition for surface treatment according to an embodiment of the present invention preferably contains a polymer compound having at least one acid functional group selected from the group consisting of a sulfonic acid (salt) group, a phosphoric acid (salt) group, and a phosphonic acid (salt) group (acid functional group-containing compound P). The polymer compound exhibits a particularly remarkable effect on removal of residues by the composition for surface treatment.

In the present specification, the "sulfonic acid (salt) group" represents a "sulfonic acid group" or a "sulfonic acid salt group", and the "phosphoric acid (salt) group" represents a "phosphoric acid group" or a "phosphoric acid salt group", and the "phosphonic acid (salt) group" represents a "phosphonic acid group" or a "phosphonic acid salt group".

Further, in the present specification, the "amino group" represents $-NH_2$ group, $-NHR$ group, or $-NRR'$ group (R and R' each independently represent a hydrocarbon group). The "polymer compound having an amino group" also includes an ammonium cation derived from the amino group, and an ammonium compound or ammonium salt which is a salt of the ammonium cation and another anion.

The ionic functional group-containing polymer may be used alone or in combination of two or more types thereof. Among them, a polymer compound having a sulfonic acid (salt) group (sulfonic acid (salt) group-containing polymer) is particularly preferable, from the viewpoint that an action of negatively charging residues, in particular, the surface of organic residues and the surface of the object to be subjected to surface treatment, is strong.

When the ionic functional group forms a salt, it may be in a form in which a part of the ionic functional group is a salt (partial salt form) or in a form in which all are salts. When the ionic functional group-containing polymer has a functional group other than the ionic functional group, the other functional group may constitute a salt. When the other functional group forms a salt, it may be in a form in which a part of the other functional group is a salt (partial salt form) or in a form in which all are salts.

As the ionic functional group-containing polymer, a synthetic product may be used or a commercially available product may be used.

(Sulfonic Acid (Salt) Group-Containing Polymer)

The sulfonic acid (salt) group-containing polymer is a polymer compound having a sulfonic acid (salt) group, and is not particularly limited as long as it has a plurality of sulfonic acid (salt) groups, and known compounds can be used. Examples of the sulfonic acid (salt) group-containing polymer include a polymer compound obtained by sulfonating a polymer compound that serves as a base, a polymer compound obtained by (co)polymerizing sulfonic acid (salt) group-containing monomers, and the like.

More specifically, examples preferably include at least one selected from the group consisting of a sulfonic acid (salt) group-containing polyvinyl alcohol (a sulfonic acid-modified polyvinyl alcohol), a sulfonic acid (salt) group-containing polystyrene (preferably a polystyrene sulfonic acid or a salt thereof, more preferably a polystyrene sulfonic acid), a sulfonic acid (salt) group-containing polyvinyl acetate (a sulfonic acid modified polyvinyl acetate), a sulfonic acid (salt) group-containing polyester, a (co)polymer of a sulfonic acid (salt) group-containing (meth)acrylic acid derivative, a copolymer of a (meth)acrylic group-containing monomer-a sulfonic acid (salt) group-containing monomer, a sulfonic acid (salt) group-containing polyisoprene, a sulfonic acid (salt)-containing allyl polymer, and salts thereof.

The sulfonic acid-based (co)polymer may contain another constituent unit as well as a constituent unit having a sulfonic acid (salt) group. The other constituent unit may be one introduced by copolymerizing other monomers other than a monomer having a sulfonic acid (salt) group (sulfonic acid (salt) group-containing monomer) or may be one introduced by leaving a functional group that has not been converted to a sulfonic acid (salt) group when introducing a sulfonic acid (salt) group. The other monomer copolymerizable with the sulfonic acid (salt) group-containing monomer is not particularly limited, but is preferably an ethylenically unsaturated monomer, and more preferably a vinyl-based monomer. Examples of the monomer copolymerizable with the sulfonic acid (salt) group-containing monomer include hydroxyl group- or glycidyl group-containing vinyl monomers, N-vinyl-based monomers, unsaturated carboxylic acid esters, unsaturated carboxylic acid amides or salts thereof, aromatic mono- or divinyl compounds, and the like.

More detailed specific examples of the sulfonic acid (salt) group-containing polymer include a sulfonic acid (salt) group-containing polyvinyl alcohol, polystyrene sulfonic acid, a homopolymer of acrylamide t-butylsulfonic acid (2-acrylamide-2-methylpropane sulfonic acid), a copolymer of (meth)acrylic acid and acrylamide t-butylsulfonic acid, and the like.

The sulfonic acid (salt) group-containing polymer is preferably a homopolymer of a sulfonic acid (salt) group-containing monomer, a sulfonic acid (salt) group-containing polystyrene or a copolymer of (meth)acrylic group-containing monomer-sulfonic acid (salt) group-containing monomer, more preferably a homopolymer of acrylamide t-butylsulfonic acid or a salt thereof, polystyrene sulfonic acid or a salt thereof, or a copolymer of (meth)acrylic acid and acrylamide t-butylsulfonic acid or a salt thereof, further preferably a homopolymer of acrylamide t-butylsulfonic acid, polystyrene sulfonic acid or a copolymer of (meth)acrylic acid and acrylamide t-butylsulfonic acid, still further preferably a homopolymer of acrylamide t-butylsulfonic acid or a salt thereof or polystyrene sulfonic acid or a salt thereof, and particularly preferably a homopolymer of acrylamide t-butylsulfonic acid or polystyrene sulfonic acid.

Examples of the sulfonic acid salt in which the sulfonic acid (salt) group-containing polymer may have include alkali metal salts such as sodium salts and potassium salts, salts of group 2 elements such as calcium salts and magnesium salts, amine salts, ammonium salts, and the like. Among them, sodium salts are preferable from the viewpoint of ease of availability.

Also, when the sulfonic acid (salt) group-containing polymer is a sulfonic acid (salt) group-containing polyvinyl alcohol, the degree of saponification is preferably 80% or more and preferably 85% or more (upper limit 100%), from the viewpoint of solubility.

When the ionic functional group-containing polymer contains two or more types of sulfonic acid (salt) group-containing polymers, at least one type of sulfonic acid (salt) group-containing polymer is preferably a sulfonic acid (salt) group-containing polystyrene, more preferably polystyrene sulfonic acid or a salt thereof, and further preferably polystyrene sulfonic acid.

(Phosphoric Acid (Salt) Group-Containing Polymer)

The phosphoric acid (salt) group-containing polymer is a polymer compound having a phosphoric acid (salt) group, and is not particularly limited as long as it has a plurality of phosphoric acid (salt) groups, and known compounds can be used. A main chain constituting the phosphoric acid (salt) group-containing polymer is preferably selected from the group consisting of polymers or copolymers of vinyl-based monomers, polyethers, polyesters, and copolymers thereof.

The method for producing the phosphoric acid (salt) group-containing polymer is not particularly limited, and examples include (i) a method of polymerizing a phosphoric acid (salt) group-containing monomer, (ii) a method of copolymerizing a phosphoric acid (salt) group-containing monomer with another copolymerizable monomer, (iii) a method of esterifying a polymer having one or more hydroxy groups and a compound having a phosphoric acid (salt) group, and the like.

Examples of the phosphoric acid (salt) group-containing monomer include 2-hydroxyethyl (meth)acryloyl phosphate, phenyl-2-acryloyloxyethyl phosphate, and the like.

Further, examples of another copolymerizable monomer include aromatic vinyl compounds such as styrene, α-methylstyrene, vinyltoluene, 2,4-dimethylstyrene, ethylstyrene, phenylstyrene, cyclohexylstyrene and benzylstyrene; hydroxy group-containing vinyl monomers such as hydroxystyrene, N-methylol (meth)acrylamide, hydroxyethyl (meth)acrylate, hydroxypropyl (meth) acrylate, polyethylene glycolmono(meth)acrylate and 2-hydroxyethyl propenyl ether; alkyl (meth)acrylates such as methyl (meta)acrylate, ethyl (meth)acrylate, propyl (meth)acrylate, butyl (meth)acrylate, 2-ethylhexyl (meth)acrylate, dodecyl (meth)acrylate, hexadecyl (meth)acrylate and eicosyl (meth)acrylate, and the like.

Moreover, polyphosphoric acid, hexametaphosphoric acid and the like can also be illustrated as the phosphoric acid (salt) group-containing polymer.

According to an embodiment of the present invention, the phosphoric acid (salt) group-containing polymer is preferably a (co)polymer containing a constituent unit A having a phosphoric acid (salt) group and a divalent (poly)oxyhydrocarbon group or a salt thereof (hereinafter, also simply referred to as "phosphoric acid-based (co)polymer"). Here, the "divalent (poly)oxyhydrocarbon group" means at least one of a divalent oxyhydrocarbon group represented by (—O—R"—) or (—R"—O—) (wherein R" represents a divalent hydrocarbon) and a divalent polyoxyhydrocarbon group in which two or more divalent hydrocarbon groups are linked by an ether bond.

In the composition for surface treatment according to an embodiment of the present invention, the constituent unit A preferably has a structure in which a phosphoric acid (salt) group and a divalent (poly)oxyhydrocarbon group are directly bonded, and the constituent unit A is more preferably represented by the following general formula (1). In these constituent units A, the divalent hydrocarbon group in the "divalent (poly)oxyhydrocarbon group" is preferably a hydrocarbon group having 1 to 18 carbon atoms, more preferably a hydrocarbon group having 1 to 12 carbon atoms, further preferably a hydrocarbon group having 1 to 10 carbon atoms, particularly preferably a hydrocarbon group having 1 to 6 carbon atoms, and most preferably a hydrocarbon group having 2 carbon atoms, from the viewpoint of obtaining higher removability of residues. Also, the divalent hydrocarbon group in the "divalent (poly)oxyhydrocarbon group" may have a linear structure, branched structure or cyclic structure, and is preferably an alkylene group, an alkenylene group, a phenylene group or a cycloalkylene group, and more preferably an alkylene group.

[Chemical Formula 1]

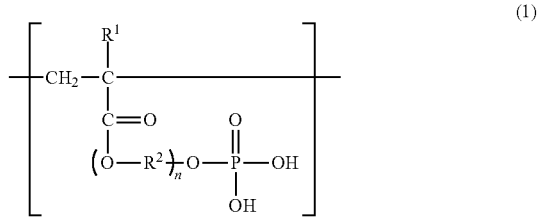

(1)

wherein $R^1$ is a hydrogen atom or an alkyl group having 1 to 4 carbon atoms, $R^2$ is a hydrocarbon group having 1 to 18 carbon atoms, and n is 1 to 10.

$R^1$ in the general formula (1) is preferably a hydrogen atom or an alkyl group having 1 to 3 carbon atoms, more preferably a hydrogen atom, a methyl group or an ethyl group, further preferably a hydrogen atom or a methyl group, and particularly preferably a methyl group, from the viewpoint of obtaining higher removability of residues.

$R^2$ in the general formula (1) is preferably a hydrocarbon group having 1 to 12 carbon atoms, more preferably a hydrocarbon group having 1 to 10 carbon atoms, further preferably a hydrocarbon group having 1 to 6 carbon atoms, and particularly preferably a hydrocarbon group having 2 carbon atoms. Moreover, the type of hydrocarbon group which is $R^2$ may be a linear structure, branched structure, or cyclic structure, and is preferably an alkylene group, an alkenylene group, a phenylene group or a cycloalkylene group, and more preferably an alkylene group.

In the phosphoric acid-based (co)polymer, both ends of the main chain are preferably hydrogen atoms.

Preferred specific examples of the monomer providing the constituent unit A represented by the general formula (1) include methacryloyloxymethyl phosphate, methacryloyloxyethyl phosphate, methacryloyloxypropyl phosphate, methacryloyloxybutyl phosphate, methacryloyloxypentyl phosphate, methacryloyloxyhexyl phosphate, methacryloyloxyoctyl phosphate, methacryloyloxydecyl phosphate, methacryloyloxylauryl phosphate, methacryloyloxystearyl phosphate, methacryloyloxy-1,4-dimethylcyclohexyl phosphate and the like and salts thereof, and the like. Among them, methacryloyloxymethyl phosphate, methacryloyloxyethyl phosphate, methacryloyloxypropyl phosphate or salts thereof are preferable, and methacryloyloxyethyl phosphate or a salt thereof is more preferable, from the viewpoint of obtaining higher removability of residues. In addition, methacryloyloxyethyl phosphate provides the constituent unit having a structure represented by the following general formula (2).

[Chemical Formula 2]

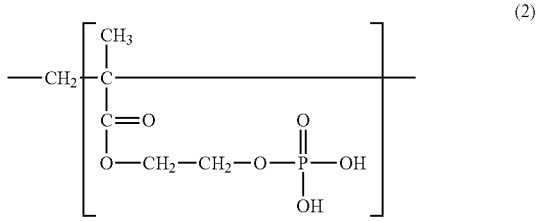

(2)

As the phosphoric acid-based (co)polymer, any of an acid form, a salt form or a form in which a part of the acid is a salt (partial salt form) can be used. When the phosphoric acid-based (co)polymer is a salt, the phosphoric acid group contained in the constituent unit A may form a salt, another constituent units described later may form a salt, or both of these may form a salt. As a salt of the phosphoric acid-based (co)polymer, it is preferred that the phosphoric acid group contained in the constituent unit A at least form a salt.

When the phosphoric acid (salt) group contained in the constituent unit A forms a salt, it may be in a form in which a part of the phosphoric acid (salt) group is a salt (partial salt form) or may be in a form in which all are phosphates, but is more preferably a partial salt form.

The type of phosphate is not particularly limited, and examples include metal salts, ammonium salts, amine salts, and the like. In addition, the salts can be used either singly or in combination of two or more types. Examples of a counter ion constituting the metal salt include metals belonging to group 1, group 11, group 2, group 12, group 3, group 13, group 4, group 6, group 7 or group 8 of a periodic table (long period). Examples of the metal salt include alkali metal salts such as sodium salts and potassium salts, salts of group 2 elements such as calcium salts and magnesium salts, and the like. Examples of a counter ion constituting the amine salt include tetramethyl ammonium, tetraethyl ammonium, tetrabutyl ammonium, and the like. Among them, sodium salts are preferable from the viewpoint of ease of availability.

In addition, the constituent unit A can be used either singly or in combination of two or more types.

When the phosphoric acid-based (co)polymer is a copolymer, it contains another constituent unit together with the constituent unit A. The other constituent unit may be one introduced by copolymerizing other monomers other than a monomer having a phosphoric acid (salt) group (phosphoric acid (salt) group-containing monomer) or may be one introduced by leaving a functional group that has not been converted to a phosphoric acid (salt) group when introducing a phosphoric acid (salt) group. The monomer providing the other constituent unit is not particularly limited, but is preferably an ethylenically unsaturated monomer, and more preferably a vinyl-based monomer. Examples of the other monomer copolymerizable with the phosphoric acid (salt) group-containing monomer include hydroxyl group- or glycidyl group-containing vinyl monomers, N-vinyl-based monomers, unsaturated carboxylic acids or salts thereof, unsaturated carboxylic acid esters, unsaturated carboxylic acid amides or salts thereof, aromatic mono- or divinyl compounds, and the like. In addition, the other constituent unit can be used either singly or in combination of two or more types.

When the other constituent unit is a salt, the salt may be a partial salt form or in a form in which all of the groups capable of forming a salt are salts. Here, the type of the salt and the type of the counter ion constituting the salt are not particularly limited, and may be, for example, those mentioned above for the salt.

When the phosphoric acid-based (co)polymer is a copolymer, the repeating form of each constituent unit may be any of random, block, or graft.

Although the method for producing the phosphoric acid-based (co)polymer is not particularly limited, and examples include a (co)polymerization method of monomers. As the (co)polymerization method of monomers, known polymerization methods such as bulk polymerization and solution polymerization can be used. At this time, a solubility (20° C.) in water of a polymerization solvent is preferably 10% by mass or more. Examples of the polymerization solvent include, for example, water, alcohols, ketones, ethers, and the like. The polymer solvent can be used either singly or in combination of two or more types. A known radical initiator is used as an example of a polymerization initiator. In polymerization, a known chain transfer agent is used as necessary, for example, a phosphoric acid-based (co)polymer can be obtained by performing solution polymerization of a raw material compound by refluxing a solvent at 40 to 300° C. under nitrogen gas flow, or the like.

(Phosphonic Acid (Salt) Group-Containing Polymer)

The phosphonic acid (salt) group-containing polymer is a polymer compound having a phosphonic acid (salt) group, and is not particularly limited as long as it has a plurality of phosphonic acid (salt) groups, and known compounds can be used. The phosphonic acid (salt) group-containing polymer is not particularly limited, and may be any of a homopolymer of a phosphonic acid (salt) group-containing monomer, a copolymer of a phosphonic acid (salt) group-containing monomer and other copolymerizable monomer, and salts thereof, and the copolymer or a salt thereof is preferable.

Examples of the phosphonic acid group-containing monomers include vinylphosphonic acid, monovinyl phosphate, allylphosphonic acid, monoallyl phosphate, 3-butenyl phosphonic acid, mono-3-butenyl phosphate, 4-vinyloxybutyl phosphate, phosphonoxyethyl acrylate, phosphonoxyethyl methacrylate, mono(2-hydroxy-3-vinyloxypropyl) phosphate, (1-phosphonoxymethyl-2-vinyloxyethyl) phosphate, mono(3-allyloxy-2-hydroxypropyl) phosphate, mono-2-(allyloxy-1-phosphonoxymethylethyl) phosphate, 2-hydroxy-4-vinyloxymethyl-1,3,2-dioxaphosphole, 2-hydroxy-4-allyloxymethyl-1,3,2-dioxaphosphole, and the like. In addition, these may be used either singly or in combination of two or more types.

In addition, when the phosphonic acid (salt) group-containing polymer is a copolymer, it contains another constituent unit as well as a constituent unit having a phosphonic acid (salt) group. The other constituent unit may be one introduced by copolymerizing other monomers other than a monomer having a phosphonic acid (salt) group (phosphonic acid (salt) group-containing monomer) or may be one introduced by leaving a functional group that has not been converted to a phosphonic acid (salt) group when introducing a phosphonic acid (salt) group. The monomer copolymerizable with the phosphonic acid group-containing monomer is not particularly limited, and examples include monomers providing the other constituent unit other than the constituent unit A, described in the section of the phosphoric acid (salt) group-containing polymer. In addition, the other constituent unit can be used either singly or in combination of two or more types.

At least a part of the phosphonic acid groups of these phosphonic acid (salt) group-containing polymers may be a salt form. Examples of the salt include alkali metal salts such as sodium salts and potassium salts, salts of group 2 elements such as calcium salts and magnesium salts, amine salts, ammonium salts, and the like. Among them, sodium salts are preferable from the viewpoint of ease of availability.

(Amino Group-Containing Polymer)

The amino group-containing polymer is a polymer compound having an amino group, and is a polymer having a plurality of amino groups, an ammonium cation derived from the polymer, or an ammonium compound or an ammonium salt which is a salt of the ammonium cation and another anion. The amino group-containing polymer is not particularly limited, and known compounds can be used.

The amino group-containing polymer is not particularly limited, and may be any of a homopolymer of an amino group-containing monomer, a copolymer of an amino group-containing monomer and a monomer copolymerizable with the amino group-containing monomer, or an ammonium cation, ammonium compound or ammonium salt thereof, but the copolymer or the ammonium cation, ammonium compound or ammonium salt thereof is preferable.

Here, the amino group represents —NH$_2$ group, —NHR''' group, or —NR'''R'''' group as described above, and R''' and R'''' are each independently a substituted or unsubstituted hydrocarbon group. Here, examples of the hydrocarbon group include alkyl groups, aryl groups, and the like. The alkyl group is preferably an alkyl group having 1 to 20 carbon atoms. Also, the aryl group is preferably an aryl group having 1 to 20 carbon atoms. Further, R''' and R'''' may each independently contain a group other than a hydrocarbon group, for example, an ester group, an ether group, an amide group, an imide group, a sulfide group, a disulfide group, a sulfinyl group, a sulfonyl group, or the like, as a site not directly bonded to an N atom constituting the amino group as a substituent, and the hydrocarbon group constituting R''' and R'''' may form a cyclic structure.

Examples of the amino group-containing monomer include vinylamine, N-vinylcarbazole, and the like. In addition, these may be used either singly or in combination of two or more types.

In addition, when the amino group-containing polymer is a copolymer, it contains another constituent unit as well as a constituent unit having an amino group. The other constituent unit may be one introduced by copolymerizing monomers other than the amino group-containing monomer or may be one introduced by leaving a functional group that has not been converted to an amino group when introducing an amino group. The monomer copolymerizable with the amino group-containing monomer is not particularly limited, but is preferably an ethylenically unsaturated monomer, and more preferably a vinyl-based monomer. Examples of the monomer copolymerizable with the amino group-containing monomer include hydroxyl group- or glycidyl group-containing vinyl monomers, N-vinyl-based monomers, unsaturated carboxylic acid esters, unsaturated carboxylic acid amides or salts thereof, aromatic mono- or divinyl compounds, and the like. In addition, the other constituent unit can be used either singly or in combination of two or more types.

At least a part of the amino groups of these amino group-containing polymers may be an ammonium cation form. Examples of the ammonium cation include a cation in which an N atom of an amino group and a hydrogen atom are bonded, or a cation in which an N atom of an amino group and a substituted or unsubstituted monovalent hydrocarbon group having 1 to 20 carbon atoms are bonded, and the like. Also, at least a part of these ammonium cations may be an ammonium compound or ammonium salt form. Examples of the salt or compound include alkali metal salts such as sodium salts and potassium salts, salts of group 2 elements such as calcium salts and magnesium salts, and the like. Among them, sodium salts are preferable from the viewpoint of ease of availability.

Preferred Embodiment When Using (Co)polymer as Ionic Functional Group-Containing Polymer The ionic functional group-containing polymer according to an embodiment of the present invention preferably contains a copolymer containing a constituent unit having at least one ionic functional group selected from the group consisting of a sulfonic acid (salt) group and an amino group and another constituent unit (hereinafter, also simply represented as "copolymer W"). The ionic functional group-containing polymer contains at least one type of copolymer W, whereby the effect of removing residues is further improved.

The reason is presumed as follows. When the ionic functional group-containing polymer is adsorbed to an object to be subjected to surface treatment or residues electrostatically or by hydrophobic interaction, wettability of surfaces thereof is further improved by the presence of another constituent unit. As a result, water is likely to enter between the composition for surface treatment and the residues, adsorptive power between the object to be subjected to surface treatment and the residues is further reduced, and it becomes easier to remove the residues. The above mechanism is based on a presumption, and whether it is correct or incorrect has no influence on the technical scope of the present invention.

In the present specification, a copolymer containing a constituent unit having a sulfonic acid (salt) group and another constituent unit is also simply represented as a sulfonic acid (salt) group-containing copolymer, and a copolymer containing a constituent unit having an amino group and another constituent unit is also simply represented as an amino group-containing copolymer.

Improvement in residue removing effect by the copolymer W becomes remarkable when the composition for surface treatment according to an embodiment of the present invention containing the copolymer W is used for rinse polishing treatment. Further, since the residues become easily removable by the copolymer W, the improvement in residue removing effect becomes more remarkable by further performing post-cleaning treatment in addition to the rinse polishing treatment using the composition for surface treatment.

Further, the improvement in residue removing effect by the copolymer W becomes remarkable when the composition for surface treatment contains silicon nitride, silicon oxide or polysilicon, becomes more remarkable when it contains silicon nitride or polysilicon, and becomes further remarkable when it contains silicon nitride.

The type of the copolymer W is not particularly limited, and examples include a random copolymer, an alternating copolymer, a block copolymer, a graft copolymer, and the like. Among them, a graft copolymer is preferable.

The other constituent unit that may be contained in the copolymer W may be introduced by copolymerizing other monomers other than a monomer having at least one ionic functional group selected from the group consisting of a sulfonic acid (salt) group, and an amino group. Moreover, the other constituent unit may be one introduced by leaving a functional group that has not been converted to a sulfonic acid (salt) group or an amino group when introducing these groups.

The other constituent unit that may be contained in the copolymer W is preferably a constituent unit derived from an ethylenically unsaturated monomer, and more preferably a constituent unit derived from a vinyl-based monomer.

Here, the "constituent unit derived from a monomer" does not represent only the constituent unit derived from the monomer when a copolymer is synthesized by directly copolymerizing the monomer. The "constituent unit derived from a monomer" also contains a constituent unit derived from the monomer in the case where a copolymer can be synthesized when assuming that the monomer can be directly copolymerized. For example, with regard to the constituent unit consisting of —$CH_2$—CH(OH)—, vinyl alcohol ($CH_2$=CH(OH)) is unstable as a monomer, so that it is difficult to synthesize a copolymer by direct polymerization, using vinyl alcohol as a monomer. However, when the polymer compound has the constituent unit as a result, the constituent unit is represented as a constituent unit derived from vinyl alcohol.

The ethylenically unsaturated monomer constituting the other constituent unit is not particularly limited, and examples include vinyl alcohol: styrene-based monomers such as styrene, o-methylstyrene, m-methylstyrene, p-methylstyrene, α-methylstyrene, p-phenylstyrene, p-ethylstyrene, 2,4-dimethylstyrene, p-tert-butylstyrene, p-n-hexylstyrene, p-n-octylstyrene, p-n-nonylstyrene, p-n-decylstyrene, and p-n-dodecylstyrene; (meth)acrylic acid ester-based monomers such as methyl(meth)acrylate, ethyl(meth)acrylate, n-propyl(meth)acrylate, isopropyl(meth)acrylate, n-butyl(meth)acrylate, isobutyl(meth)acrylate, t-butyl(meth)acrylate, n-octyl(meth)acrylate, 2-ethylhexyl(meth)acrylate, stearyl(meth)acrylate, lauryl(meth)acrylate, phenyl(meth)acrylate, diethylaminoethyl(meth)acrylate, and dimethylaminoethyl(meth)acrylate; carboxy group-containing ethylenic unsaturated monomers such as (meth)acrylc acid, maleic acid, itaconic acid, cinnamic acid, fumaric acid, maleic acid monoalkyl ester, and itaconic acid monoalkyl ester; olefin-based monomers such as ethylene, propylene, and isobutylene; vinyl ester-based monomers such as vinyl propionate, vinyl acetate, and vinyl benzoate; vinyl ether-based monomers such as vinyl methyl ether and vinyl ethyl ether; vinyl ketone-based monomers such as vinyl methyl ketone, vinyl ethyl ketone, and vinyl hexyl ketone; N-vinyl-based monomers other than the aforementioned amino group-containing monomers such as N-vinylindole, N-vinylformamide, and N-vinylpyrrolidone; vinyl-based monomers such as vinyl naphthalene and vinyl pyridine; (meth)acrylic acid derivatives such as acrylonitrile, methacrylonitrile, and acrylamide; and the like. In the present specification, (meth)acrylic is a generic term including acrylic and methacrylic, and (meth)acrylate is a generic term including acrylate and methacrylate.

Among them, the ethylenically unsaturated monomer constituting the other constituent unit is preferably a vinyl-based monomer, that is, a monomer having a vinyl group, more preferably vinyl alcohol, vinyl acetate, acrylic acid or an N-vinyl-based compound other than the aforementioned amino group-containing monomers, further preferably vinyl alcohol, vinyl acetate, acrylic acid, N-vinyl indole, N-vinyl formamide or N-vinyl pyrrolidone, still further preferably vinyl alcohol, vinyl acetate, acrylic acid or N-vinyl pyrrolidone, particularly preferably acrylic acid, vinyl acetate or vinyl alcohol, extremely preferably acrylic acid or vinyl alcohol, and most preferably acrylic acid.

When the other constituent unit is a constituent unit derived from an ethylenically unsaturated monomer, the constituent unit derived from at least one ionic functional group-containing monomer selected from the group consisting of a sulfonic acid (salt) group, a phosphoric acid (salt) group, a phosphonic acid (salt) group, and an amino group, is preferably a constituent unit derived from an ethylenically unsaturated monomer, and more preferably a constituent unit derived from a vinyl-based monomer.

Among the copolymers W, a sulfonic acid (salt) group-containing copolymer is preferable, a sulfonic acid (salt) group-containing polyvinyl alcohol which is a sulfonic acid (salt) group-containing copolymer, or a copolymer of (meth)acrylic group-containing monomer-sulfonic acid (salt) group-containing monomer is more preferable, a sulfonic acid (salt) group-containing polyvinyl alcohol, or a copolymer of (meth)acrylic acid and acrylamide t-butylsulfonic acid is further preferable, and a copolymer of (meth)acrylic acid and acrylamide t-butylsulfonic acid is most preferable.

In addition, when the ionic functional group-containing polymer according to an embodiment of the present invention contains the copolymer W, the ionic functional group-containing polymer preferably further contains a homopolymer (homopolymer D) consisting of only a constituent unit having at least one acid functional group selected from the group consisting of a sulfonic acid (salt) group, a phosphoric acid (salt) group and a phosphonic acid (salt) group. By further containing the homopolymer D, the effect of removing residues is remarkably improved. In addition, a partial salt shall be included in a homopolymer.

The homopolymer D is not particularly limited, and examples include the homopolymers each exemplified in the description of the sulfonic acid (salt) group-containing polymer, phosphoric acid (salt) group-containing polymer and phosphoric acid (salt) group-containing polymer mentioned above.

Among the homopolymer D, a sulfonic acid (salt) group-containing homopolymer is preferable, a sulfonic acid (salt) group-containing polystyrene is more preferable, polystyrene sulfonic acid or a salt thereof is further preferable, and polystyrene sulfonic acid is particularly preferable.

When the ionic functional group-containing polymer contains the copolymer W and the homopolymer D, the content ratio of the homopolymer D is preferably 50% by mass or more, based on the total mass of the copolymer W and the homopolymer D. In this range, an electrostatic adsorption effect by the homopolymer D and an adsorption effect by hydrophobic interaction, and a remarkable electrostatic repulsive effect are further improved. From the same viewpoint, the content ratio of the homopolymer D is more preferably 70% by mass or more, and further preferably 80% by mass or more, based on the total mass of the copolymer W and the homopolymer D. Moreover, the content rate of the homopolymer D is preferably 99% by mass or less, based on the total mass of the copolymer W and the homopolymer D. In this range, an effect of improving wettability by the copolymer W is more improved. From the same viewpoint, the content ratio of the homopolymer D is more preferably 95% by mass or less, and further preferably 90% by mass or less, based on the total mass of the copolymer W and the homopolymer D. Incidentally, when it is an ionic functional group-containing polymer in which both the copolymer W and the homopolymer D are essential components (that is, one in which an ionic functional group density is more than 10% and a pKa is 3 or less, or preferred embodiment of it, excluding one classified in the wetting agent described later), it is extremely preferred that the content ratio of the homopolymer D satisfy the above ranges.

(Ionic Functional Group Density of Ionic Functional Group-Containing Polymer)

In the present invention, the ionic functional group density represented by the following formula (1) of the ionic functional group-containing polymer (which is an essential component) essentially contained in the composition for surface treatment is more than 10%.

[Mathematical Formula 3]

Ionic functional group density (%)=100×(Number of constituent unit derived from monomer having ionic functional group/Number of constituent unit derived from all monomers constituting polymer compound)     Formula (1)

In addition, the ionic functional group in the formula (1) represents at least one ionic functional group selected from the group consisting of a sulfonic acid (salt) group, a phosphoric acid (salt) group, a phosphonic acid (salt) group, and an amino group of the ionic functional group-containing polymer according to an embodiment of the present invention.

In a preferred embodiment of the present invention, the ionic functional group-containing polymer (which is an essential component) essentially contained in the composition for surface treatment is acid functional group-containing polymer P, and the formula (1) is represented by the following formula (2).

[Mathematical Formula 4]

Acidic functional group density (%)=100×(Number of constituent unit derived from monomer having acidic functional group/Number of constituent unit derived from all monomers constituting polymer compound)     Formula (2)

In addition, the acid functional group in the formula (2) represents at least one acid functional group selected from the group consisting of a sulfonic acid (salt) group, a phosphoric acid (salt) group and a phosphonic acid (salt) group of the acid functional group-containing polymer P according to an embodiment of the present invention.

When the ionic functional group density is 10% or less, the ionic functional group-containing polymer alone may not sufficiently obtain or may decrease the effect of removing organic residues. From this, the ionic functional group density of the ionic functional group-containing polymer which is an essential component is preferably 20% or more, more preferably 40% or more, and further preferably 60% or more. It is still further preferably 80% or more, and particularly preferably 100% (upper limit 100%). It is presumed that the reason why good effect of removing residues can be obtained when the lower limit value of the ionic functional group density is in the above ranges is that covering properties when covering the object to be subjected to surface treatment and the positively chargeable component become better, and an action of removing the residues from the surface of the object to be subjected to surface treatment or a re-adhesion inhibiting action of the residues on the surface of the object to be subjected to surface treatment is further improved.

The ionic functional group density can be controlled, for example, by the amount of the monomer having an ionic functional group (sulfonic acid (salt) group-containing monomer, phosphoric acid (salt) group-containing monomer, phosphoric acid (salt) group-containing monomer, amino group-containing monomer) used when producing an ionic functional group-containing polymer. Also, the ionic functional group density can be measured by ICP emission spectrometry (high frequency inductively coupled plasma emission spectrometry), atomic absorption spectrometry, or the like.

Here, the aforementioned copolymer containing a constituent unit having at least one ionic functional group selected from the group consisting of a sulfonic acid (salt) group and an amino group and another constituent unit, in which the ionic functional group density is 10% or less, may be further contained in the composition for surface treatment as a wetting agent described later.

(pKa of Ionic Functional Group-Containing Polymer)

In the present invention, the pKa of the ionic functional group-containing polymer (which is an essential component) essentially contained in the composition for surface treatment is 3 or less. When the pKa is more than 3, good covering properties on the surface of the object to be subjected to surface treatment and the surface of the positively chargeable component, an appropriate electrostatic repulsive force for removing residues, good removability of the ionic functional group-containing polymer after the surface treatment step and the like cannot be obtained. The pKa is preferably 2 or less, and more preferably 1.5 or less. Further, the pKa is preferably 0.8 or more, from the viewpoint of good covering properties on the surface of the positively charged component. The pKa can be calculated by the following method.

The acid dissociation constant (pKa) of the ionic functional group-containing polymer is an index of acidity, and a common logarithm is employed as a reciprocal of the dissociation constant (Ka) of the ionic functional group-containing polymer. That is, the acid dissociation constant (pKa) of the ionic functional group-containing polymer is obtained by measuring the acid dissociation constant Ka= $[H_3O^-][B^-]/[BH]$ under the condition of dilute aqueous solution and using pKa=−log Ka. In the above formula, BH represents an ionic functional group-containing polymer, and B⁻ represents a conjugate base of the ionic functional group-containing polymer. The measurement method of pKa measures a hydrogen ion concentration using a pH meter, and can calculate pKa from the concentration of the substance, and the hydrogen ion concentration.

When the ionic functional group-containing polymer is a copolymer, the first dissociation constant is referred to as pKa for convenience.

Here, pKa of the amino group-containing polymer represents pKa of organic ammonium ion which is a conjugate acid.

When the ionic functional group-containing polymer is a salt form, pKa represents the value of pKa of an acid constituting the salt. For example, when the ionic functional group-containing polymer is a sulfonate group-containing polymer, i.e., a salt form of a sulfonic acid group-containing polymer, as the pKa of the ionic functional group-containing polymer, the value of pKa of the sulfonic acid group-containing polymer is used.

Here, the aforementioned copolymer containing a constituent unit having at least one ionic functional group selected from the group consisting of a sulfonic acid (salt) group and an amino group and another constituent unit, in which the pKa is more than 3, may be further contained in the composition for surface treatment as a wetting agent described later.

(Weight Average Molecular Weight of Ionic Functional Group-Containing Polymer)

In the present invention, the weight average molecular weight of an ionic functional group-containing polymer which is an essential component (that is, one in which an ionic functional group density is more than 10% and a pKa is 3 or less, or preferred embodiment of it, excluding one classified in the wetting agent described later) is preferably 1000 or more. When the weight average molecular weight is 1,000 or more, the effect of removing residues is further enhanced. It is presumed that the reason is that the covering properties when covering the object to be subjected to surface treatment and the positively chargeable component become better, and an action of removing the residues from the surface of the object to be subjected to surface treatment or a re-adhesion inhibiting action of the residues on the surface of the object to be subjected to surface treatment is further improved. From the same viewpoint, the weight average molecular weight is more preferably 2,000 or more, further preferably 8,000 or more, still further preferably 9,000 or more, and particularly preferably 10,000 or more. In addition, the weight average molecular weight of an ionic functional group-containing polymer which is an essential component (that is, one in which an ionic functional group density is more than 10% and a pKa is 3 or less, or preferred embodiment of it, excluding one classified in the wetting agent described later) is preferably is 100,000 or less. When the weight average molecular weight is 100,000 or less, the effect of removing residues is further enhanced. It is presumed that the reason is that removability of the ionic functional group-containing polymer which is an essential component after the surface treatment step becomes better. From the same viewpoint, the weight average molecular weight is more preferably 50,000 or less, and further preferably 25,000 or less. The weight average molecular weight of the ionic functional group-containing polymer can be measured by gel permeation chromatography (GPC).

The content of an ionic functional group-containing polymer which is an essential component (that is, one in which an ionic functional group density is more than 10% and a pKa is 3 or less, or preferred embodiment of it, excluding one classified in the wetting agent described later) is preferably 0.01% by mass or more based on the total mass of a composition for surface treatment. When the content of the ionic functional group-containing polymer which is an essential component is in this range, the effect of removing residues is further improved. It is presumed that the reason is that, when the object to be subjected to surface treatment and the positively chargeable component are coated with the ionic functional group-containing polymer which is an essential component, these are coated in a larger area. In addition, it is presumed that the increase in the number of ionic functional groups can exhibit electrostatic adsorption or repulsive effect more strongly. From the same viewpoint, the content of the ionic functional group-containing polymer which is an essential component is preferably 0.03% by mass or more, further preferably 0.05% by mass or more, still further preferably 0.1% by mass or more, and particularly preferably 0.5% by mass or more, based on the total mass of the composition for surface treatment. In addition, the content of the ionic functional group-containing polymer which is an essential component (that is, one in which an ionic functional group density is more than 10% and a pKa is 3 or less, or preferred embodiment of it, excluding one classified in the wetting agent described later) is preferably 10% by mass or less based on the total mass of a composition for surface treatment. When the content of the ionic functional group-containing polymer which is an essential component is in this range, the effect of removing residues is further enhanced. It is presumed that the reason is that removability of the ionic functional group-containing polymer which is an essential component after the surface treatment step becomes better. From the same viewpoint, the content of the ionic functional group-containing polymer which is an essential component is more preferably 5% by mass or less, further preferably 3% by mass or less, still further preferably 2% by mass or less, and particularly preferably 1% by mass or less, based on the total mass of the composition for surface treatment.

In addition, the content of an ionic functional group-containing polymer which is an essential component (that is, one in which an ionic functional group density is more than 10% and a pKa is 3 or less, or preferred embodiment of it, excluding one classified in the wetting agent described later) is preferably 50% by mass or more (upper limit 100% by mass) based on the total mass of polymer compounds (polymer) contained in the composition for surface treatment (total mass of the ionic functional group-containing polymer which is an essential component and other polymer compounds of a molecular weight of 1000 or more). When the content of the ionic functional group-containing polymer which is an essential component is in this range, the effect of removing residues is further improved. The reason is that the amount of the polymer other than the ionic functional group-containing polymer which is an essential component that may cause residues after the surface treatment step is reduced. In addition, it is presumed that the reason is that, when the object to be subjected to surface treatment and the positively chargeable component are coated with the ionic functional group-containing polymer, it is reduced that the coating is prevented by the polymer compound other than the ionic functional group-containing polymer. Furthermore, it is presumed that the reason is that, it is reduced that the electrostatic adsorption effect or the repulsive effect by the ionic functional group-containing polymer which is an essential component is prevented by the polymer compound other than the ionic functional group-containing polymer which is an essential component. From the same viewpoint, the content of the ionic functional group-containing polymer which is an essential component is more preferably more than 80% by mass, and further preferably more than 95% by mass, based on the total mass of the polymer compounds contained in the composition for surface treatment, and is further preferably 100% by mass based on the total mass of the polymer compounds contained in the composition for surface treatment, that is, it is only an ionic functional group-containing polymer in which the polymer compound contained in the composition for surface treatment is an essential component. In particular, when the content of the ionic functional group-containing polymer which is an essential component is more than 95% by mass based on the total mass of the polymer compound contained in the composition for surface treatment, the effect of removing residues is remarkably improved.

[Wetting Agent]

The composition for surface treatment according to an embodiment of the present invention may further contain a wetting agent. In the present specification, the wetting agent refers to a water-soluble polymer having a function of improving wettability of the surface of the object to be subjected to surface treatment and improving a residue removing effect.

Examples of the polymer compound that can be used as the wetting agent include the above-mentioned copolymer W, which has an ionic functional group density of 10% or less. Also, examples include the above-mentioned copolymer W having a pKa of more than 3. Here, the description of each constituent unit of the above-mentioned ionic functional group-containing polymer can be referred to, also for the description of the constituent unit having at least one ionic functional group selected from the group consisting of a sulfonic acid (salt) group and an amino group, which constitutes the copolymer W, and another constituent units, as the wetting agent.

In addition, examples of other polymer compound that can be used as the wetting agent include copolymers containing constituent units having a carboxylic acid (salt) group and another constituent unit (hereinafter, also simply referred to as carboxylic acid (salt) group-containing copolymers). In the present specification, a copolymer containing a constituent unit having a carboxylic acid (salt) group, and further containing a constituent unit having at least one ionic functional group selected from the group consisting of a sulfonic acid (salt) group, a phosphoric acid (salt) group, a phosphoric acid (salt) group, and an amino group, is treated as the above-mentioned ionic functional group-containing polymer, not the carboxylic acid (salt) group-containing copolymer. Here, the carboxylic acid (salt) group-containing monomer constituting the constituent unit having a carboxylic acid (salt) group is not particularly limited, and examples include carboxy group-containing ethylenic unsaturated monomers such as (meth)acrylic acid, maleic acid, itaconic acid, cinnamic acid, fumaric acid, maleic acid monoalkyl ester and itaconic acid monoalkyl ester, and the like. Further, the other monomer constituting the other constituent unit is not particularly limited, and examples can include ethylenically unsaturated monomers constituting the other constituent unit mentioned in the description of the above-mentioned copolymer W (excluding the carboxy group-containing ethylenic unsaturated monomer). Among these ethylenically unsaturated polymers, vinyl-based monomers are preferable. In addition, the type of the carboxylic acid (salt) group-containing copolymer is not particularly limited, and examples include a random copolymer, an alternating copolymer, a block copolymer, a graft copolymer, and the like. The content ratio of the number of constituent units derived from the monomer having a carboxylic acid (salt) group is not particularly limited, but is preferably 1% by mol or more and 99% by mol or less, based on the number of constituent units derived from all monomers constituting the carboxylic acid (salt) group-containing copolymer. When the carboxylic acid (salt) group forms a salt, it may be in a form in which a part of the carboxylic acid (salt) group is a salt (partial salt form) or in a form in which all are salts. When the carboxylic acid (salt) group-containing copolymer has a functional group other than the carboxylic acid (salt) group, the other functional group may constitute a salt. When the other functional group forms a salt, it may be in a form in which a part of the other functional group is a salt (partial salt form) or in a form in which all are salts. Examples of the salt include alkali metal salts such as sodium salts and potassium salts, salts of group 2 elements such as calcium salts and magnesium salts, amine salts, ammonium salts, and the like. Among them, sodium salts are preferable from the viewpoint of ease of availability.

Furthermore, specific examples of other polymer compounds that can be used as the wetting agent include water-soluble polymers such as hydroxyethyl cellulose (HEC), polyvinyl alcohol (PVA), polyglycerol, polyoxyethylene polyglyceryl ether, polyoxyethylene fatty acid amide ether, and polyvinyl pyrrolidone (PVP).

Among them, at least one selected from the group consisting of copolymers W having an ionic functional group density of 10% or less, copolymers W having a pKa of more than 3, carboxylic acid (salt) group-containing copolymers, polyvinyl alcohol and polyvinyl pyrrolidone is preferable. In addition, at least one selected from the group consisting of sulfonic acid group (salt) group-containing copolymers having an ionic functional group density of 10% or less, sulfonic acid group (salt) group-containing copolymers having a pKa of more than 3 and carboxylic acid (salt) group-containing copolymers is more preferable. Moreover, at least one selected from the group consisting of sulfonic acid group (salt) group-containing copolymers having an ionic functional group density of 10% or less and sulfonic acid group (salt) group-containing copolymers having a pKa of more than 3 is further preferable. Here, the preferable structure of the copolymer W is the same as the description in the above-mentioned ionic functional group-containing polymer. Among them, sulfonic acid group (salt) group-containing copolymers having an ionic functional group density of 10% or less are particularly preferable.

Among the sulfonic acid group (salt) group-containing copolymers having an ionic functional group density of 10% or less, sulfonic acid (salt) group-containing copolymers are preferable, and a sulfonic acid (salt) group-containing polyvinyl alcohol that is a sulfonic acid (salt) group-containing copolymer is more preferable. The sulfonic acid (salt)

group-containing polyvinyl alcohol is particularly preferably composed of a constituent unit having a sulfonic acid (salt) group and a constituent unit derived from vinyl alcohol or a constituent unit derived from vinyl acetate, and is most preferably composed of a constituent unit having a sulfonic acid (salt) group and a constituent unit derived from vinyl alcohol. The degree of saponification of the sulfonic acid (salt) group-containing polyvinyl alcohol is not particularly limited, but is preferably 80% or more and preferably 85% or more (upper limit 100%) from the viewpoint of solubility.

In the copolymer W having an ionic functional group density of 10% or less, the content ratio of the constituent unit derived from the monomer having at least one ionic functional group selected from the group consisting of a sulfonic acid (salt) group, a phosphoric acid (salt) group, a phosphoric acid (salt) group and an amino group is not particularly limited, but it is preferably 1% or more and 10% or less, and more preferably 3% or more and 6% or less, based on the constituent unit derived from all monomers constituting the copolymer W.

Also, the degree of saponification of the polyvinyl alcohol is not particularly limited, but is preferably 80% or more and preferably 85% or more (upper limit 100%) from the viewpoint of solubility.

The weight average molecular weight of the wetting agent is not particularly limited, but is preferably 1,000 or more. In this range, the effect of removing residues is further improved. It is presumed that the reason is that wettability to the surface of the object to be subjected to surface treatment is further improved. From the same viewpoint, it is more preferably 5,000 or more. Also, the weight average molecular weight of the wetting agent is preferably 1,000,000 or less. In this range, the effect of removing residues is further enhanced. It is presumed that the reason is that removability of the wetting agent after the surface treatment step becomes better. From the same viewpoint, it is more preferably 50,000 or less. The weight average molecular weight of the wetting agent can be measured by gel permeation chromatography (GPC) or the like. The details of the method of measuring the weight average molecular weight are described in the following examples.

An effect of improving a residue removing effect by a wetting agent becomes better when the composition for surface treatment according to an embodiment of the present invention containing this wetting agent is used for rinse polishing treatment. Further, since the residues become easily removable by the copolymer, the improvement in residue removing effect becomes further better by further performing post-cleaning treatment in addition to the rinse polishing treatment using the composition for surface treatment.

These wetting agents can be used either singly or in combination of two or more types.

Further, the effect of improving a residue removing effect by a wetting agent becomes better when the object to be subjected to surface treatment contains polysilicon. The content of the wetting agent is not particularly limited, and when the object to be subjected to surface treatment contains polysilicon, it is preferably 0.01% by mass or more based on the total mass of the composition for surface treatment. In this range, the effect of removing residues is improved. It is presumed that the reason is that wettability to the surface of the object to be subjected to surface treatment is further improved. From the same viewpoint, the content of the wetting agent is more preferably 0.03% by mass or more, and further preferably 0.05% by mass or more. Also, the content of the wetting agent is not particularly limited, and when the object to be subjected to surface treatment contains polysilicon, it is preferably 10% by mass or less based on the total mass of the composition for surface treatment. In this range, the effect of removing residues is further enhanced. It is presumed that the reason is that removability of the wetting agent after the surface treatment step becomes better. From the same viewpoint, the content of the wetting agent is more preferably 5% by mass or less, and further preferably 1% by mass or less.

Meanwhile, when the object to be subjected to surface treatment contains silicon nitride or silicon oxide, a wetting agent may cause foreign matters (residues), so that it is preferred that the addition amount thereof is as small as possible, it is more preferred that it contain substantially no wetting agent, and it is most preferred that it contain no wetting agent. Here, the phrase "does not substantially contain a wetting agent" refers that the content of the wetting agent is 0.01% by mass or less based on the entire composition for surface treatment.

[Water]

The composition for surface treatment according to an embodiment of the present invention essentially contains water as a dispersing medium (solvent). The dispersing medium has a function of dispersing or dissolving each component. The dispersing medium is more preferably only water. In addition, the dispersing medium may be a mixed solvent of water and an organic solvent for dispersion or dissolution of each component. In this case, examples of the organic solvent to be used include acetone, acetonitrile, ethanol, methanol, isopropanol, glycerin, ethylene glycol, propylene glycol and the like which are organic solvents miscible with water. In addition, these organic solvents may be used without being mixed with water, and each component may be dispersed or dissolved and then mixed with water. These organic solvents can be used either singly or in combination of two or more types.

Water containing no impurities as possible is preferable, from the viewpoint of inhibiting contamination of the object to be subjected to surface treatment and an action of other components. For example, water having a total content of transition metal ions of 100 ppb or less is preferable. Here, the purity of water can be enhanced, for example, by operations such as removal of impurity ions using an ion exchange resin, removal of foreign matters by a filter, distillation, and the like. Specifically, as water, for example, deionized water (ion-exchanged water), pure water, ultra-pure water, distilled water or the like is preferably used.

[Acid]

The composition for surface treatment according to an embodiment of the present invention preferably contains an acid. In the present specification, the ionic functional group-containing polymer is treated as different from the acid as the additive described herein. The acid is presumed to play a role of positively charging the surface of the object to be subjected to surface treatment and the surface of the positively chargeable component, and may contribute to the removal of residues by the composition for surface treatment.

The acid may be either an inorganic acid or an organic acid. The inorganic acid is not particularly limited, and examples include sulfuric acid, nitric acid, boric acid, carbonic acid, hypophosphorous acid, phosphorous acid, phosphoric acid, and the like. The organic acid is not particularly limited, and examples include carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid and lactic acid, and methanesulfonic acid, ethanesulfonic acid, isethionic acid, and the like.

Among them, maleic acid or nitric acid is more preferable, and maleic acid is further preferable, from the viewpoint that an effect of positively charging the surface of the object to be subjected to surface treatment and the surface of the positively chargeable component becomes better.

In addition, the acid can be used either singly or in combination of two or more types.

The content of the acid is preferably 0.05% by mass or more based on the total mass of the composition for surface treatment. When the content of the acid is 0.05 mass % or more, the effect of removing residues is further improved. It is presumed that the reason is that the effect of positively charging the surface of the object to be subjected to surface treatment containing silicon nitride or silicon oxide and the surface of the positively chargeable component becomes better. From the same viewpoint, the content of the acid is more preferably 0.1% by mass or more and further preferably 0.15% by mass or more, based on the total mass of the composition for surface treatment. Moreover, the content of the acid is 10% by mass or less based on the total mass of the composition for surface treatment. When the content of the acid is 10% by mass or less, damage to a device due to low pH can be further reduced. From the same viewpoint, the content of the acid is more preferably 5% by mass or less and further preferably 3% by mass or less, based on the total mass of the composition for surface treatment.

[pH Value]

It is essential that a pH value of the composition for surface treatment according to an embodiment of the present invention is less than 7. When the pH value is 7 or more, the effect of positively charging the surface of the object to be subjected to surface treatment or the surface of the positively chargeable component cannot be obtained, and the effect of removing residues cannot be sufficiently obtained. From the viewpoint of the residue removing effect, the pH value is more preferably less than 4, further preferably less than 3, and particularly preferably 2.5 or less. Moreover, the pH value is preferably 1 or more. When the pH value is 1 or more, the addition amount of the acid for adjusting to low pH can be reduced, which is preferable from the viewpoint of reducing cost. Based on the above, the pH value of the composition for surface treatment is preferably 1 or more and less than 3.

The pH value of the composition for surface treatment can be confirmed by a pH meter (manufactured by HORIBA, Ltd., model number: LAQUA (registered trademark)).

In adjusting the pH value, it is desirable not to add components other than the essential components of the composition for surface treatment according to an embodiment of the present invention as possible, since they may cause foreign matters. From this, it is preferable to adjust the pH value only with the acid and the ionic functional group-containing polymer. However, when it is difficult to obtain a desired pH value by these alone, it may be adjusted by using other additives such as alkali which may be optionally added, as long as the effects of the present invention are not impaired.

[Other Additives]

The composition for surface treatment according to an embodiment of the present invention may contain other additives in any proportion, as necessary, as long as the effects of the present invention are not impaired. However, it is desirable that components other than the essential components of the composition for surface treatment according to an embodiment of the present invention be not added as possible as they may cause foreign matters (residues), so that it is preferred that the addition amount thereof is as small as possible, and it is more preferred that it contain no other additives. Examples of other additives include alkalis, antiseptic agents, dissolved gases, reducing agents, oxidizing agents, polymer compounds other than ionic functional group-containing polymers, and alkanolamines, and the like.

It is preferred that the composition for surface treatment according to an embodiment of the present invention contain substantially no abrasive grains, in order to further improve a foreign matter removing effect. Here, the phrase "does not substantially contain abrasive grains" refers that the content of the abrasive grains is 0.01% by mass or less based on the entire composition for surface treatment.

<Method for Producing Composition for Surface Treatment>

The method for producing a composition for surface treatment according to an embodiment of the present invention preferably contains mixing an ionic functional group-containing polymer and water. For example, it can be obtained by stirring and mixing the ionic functional group-containing polymer, water, and, as necessary, other components. The temperature at mixing each component is not particularly limited, but is preferably 10 to 40° C., and heating may be performed to increase the rate of dissolution. Also, the mixing time is not particularly limited.

<Surface Treatment Method>

Another preferred embodiment of the present invention is a surface treatment method including surface treatment of a polished object to be polished using the composition for surface treatment. In the present specification, the surface treatment method refers to a method of reducing residues on a surface of the polished object to be polished and is a method of performing cleaning in a broad sense.

According to the surface treatment method according to an embodiment of the present invention, the residues remaining on the surface of the polished object to be polished can be sufficiently removed. That is, according to another embodiment of the present invention, there is provided a method of reducing residues on the surface of the polished object to be polished, including surface treatment of the polished object to be polished using the composition for surface treatment.

The surface treatment method according to an embodiment of the present invention is performed by a method in which the composition for surface treatment according to an embodiment of the present invention is brought into direct contact with the polished object to be polished.

Examples of the surface treatment method mainly include (I) a method by rinse polishing treatment and (II) a method by cleaning treatment. That is, it is preferred that the surface treatment according to an embodiment of the present invention be performed by a rinse polishing treatment or a cleaning treatment. The rinse polishing treatment and the cleaning treatment are performed to remove foreign matters (particles, metal contamination, organic residues, pad debris, and the like) on the surface of the polished object to be polished to obtain a clean surface. The above (I) and (II) will be described below.

(I) Rinse Polishing Treatment

The composition for surface treatment according to an embodiment of the present invention is suitably used in a rinse polishing treatment. That is, the composition for surface treatment according to an embodiment of the present invention can be preferably used as a rinse polishing composition. The rinse polishing treatment is performed on a polishing table (platen) to which a polishing pad is attached for the purpose of removing foreign matters on the surface of the object to be polished, after final polishing (finish polishing) is performed on the object to be polished. At this time, the rinse polishing treatment is performed by bringing the composition for surface treatment according to an embodiment of the present invention into direct contact with the polished object to be polished. As a result, the foreign matters on the surface of the polished object to be polished are removed by frictional force (physical action) by the polishing pad and a chemical action by the composition for surface treatment. Among the foreign matters, particles and organic residues, in particular, are easily removable by physical action. Therefore, in the rinse polishing treatment, by using friction with the polishing pad on the polishing table (platen), the particles and the organic residues can be effectively removed.

That is, in the specification of the present application, the rinse polishing treatment, the rinse polishing method and the rinse polishing step refer to a treatment, a method and a step for reducing the residues on the surface of the object to be subjected to surface treatment using the polishing pad, respectively.

Specifically, the rinse polishing treatment can be performed by placing the surface of the polished object to be polished after the polishing step on the polishing table (platen) of the polishing apparatus, bringing the polishing pad and a polished semiconductor substrate into contact with each other, and relatively sliding the polished object to be polished and the polishing pad while the composition for surface treatment (rinse polishing composition) is supplied to a contact portion.

As the polishing apparatus, a general polishing apparatus in which a holder for holding an object to be polished and a motor capable of changing rotation number or the like, are mounted, and a polishing table capable of attaching a polishing pad (polishing cloth) is provided, can be used.

The rinse polishing treatment can be performed using either a single-sided polishing apparatus or a double-sided polishing apparatus. In addition, the polishing apparatus preferably includes not only a discharge nozzle of the polishing composition but also a discharge nozzle of the rinse polishing composition. There is no particular limitation on operating conditions at the time of the rinse polishing treatment of the polishing apparatus, and those skilled in the art can appropriately set.

As the polishing pad, a general nonwoven fabric, polyurethane, and a porous fluororesin and the like can be used without particular limitation. The polishing pad is preferably grooved such that a rinse polishing composition is stored therein.

There is also no particular limitation on rinse polishing conditions, for example, the rotation number of the polishing table, and the rotation number of the head (carrier) are each preferably 10 rpm or more and 100 rpm or less, and the pressure (polishing pressure) applied to the polished object to be polished is preferably 0.5 psi or more and 10 psi or less. A method for supplying the rinse polishing composition to the polishing pad is not also particularly limited, and for example, a method for continuously supplying (flowing) the rinse polishing composition by a pump or the like is employed. A supply amount thereof is not limited, and it is preferred that the surface of the polishing pad be always covered with the rinse polishing composition, and the supply amount is preferably 10 mL/min or more and 5000 mL/min or less. The polishing time is also not particularly limited, but a step using the rinse polishing composition is preferably 5 seconds or more and 180 seconds or less.

After the rinse polishing treatment with the composition for surface treatment according to an embodiment of the present invention, the object to be subjected to surface treatment is preferably pulled up and taken out while the composition for surface treatment was applied.

(II) Cleaning Treatment

The composition for surface treatment according to an embodiment of the present invention is suitably used in a cleaning treatment. That is, the composition for surface treatment according to an embodiment of the present invention can be preferably used as a cleaning composition. The cleaning treatment is preferably performed, after the final polishing (finish polishing) is performed on the object to be polished, after the rinse polishing treatment is performed on the object to be polished, or after another rinse polishing treatment using a rinse polishing composition other than the composition for surface treatment of the present invention is performed, for the purpose of removing foreign matters on the surface of the polished object to be polished (object to be cleaned). In addition, the cleaning treatment and the rinse polishing treatment are classified according to a place where these treatments are performed, the cleaning treatment is a surface treatment performed at a place other than the polishing table (platen), and is preferably performed after separating the polished object to be polished from the polishing table (platen). Also in the cleaning treatment, by bringing the composition for surface treatment according to an embodiment of the present invention into direct contact with the polished object to be polished, foreign matters on the surface of the object can be removed.

An example of a method of performing the cleaning treatment includes (i) a method of bringing a cleaning brush into contact with a single side or double sides of a polished object to be polished while the polished object to be cleaned being held, and the surface of the object to be surface being rubbed with the cleaning brush while a composition for surface treatment is supplied to the contact portion, (ii) a method (dip-type) of immersing the polished object to be polished in the composition for surface treatment, and performing ultrasonic treatment or stirring, and the like. In this method, the foreign matters on the surface of the polished object to be polished are removed by frictional force caused by the cleaning brush, mechanical force generated by ultrasonic treatment or stirring, and a chemical action by the composition for surface treatment.

In the above method (i), the method of bringing the composition for surface treatment into contact with the polished object to be polished is not particularly limited, and examples include a spin-type in which the polished object to be polished is rotated at a high speed while the composition for surface treatment being flown onto the polished object to be polished from a nozzle, and a spray-type in which the composition for surface treatment is sprayed to clean the polished object to be polished, and the like.

As the cleaning treatment, it is preferable to adopt a spin-type or a spray-type, and a spin-type is further preferable, in terms of being capable of performing more efficient decontamination in a short time.

As an apparatus for performing such cleaning treatment, there are a batch-type cleaning apparatus for simultaneously surface treating a plurality of polished objects to be polished stored in a cassette, a sheet-type cleaning apparatus for surface treating one polished object to be polished mounted on a holder, and the like. From the viewpoint of shortening the cleaning time or the like, a method using a sheet-type cleaning apparatus is preferable.

Furthermore, examples of an apparatus for performing the cleaning treatment include a polishing apparatus provided with a cleaning facility that separates the polished object to be polished from the polishing table (platen) and then rubs the object with a cleaning brush. By using such a polishing apparatus, it is possible to more efficiently perform the cleaning treatment of the polished object to be polished.

As such a polishing apparatus, it is possible to use a general polishing apparatus having a holder for holding the polished object to be polished, a motor capable of changing the rotation number, a cleaning brush, and the like. As a polishing apparatus, either a single-sided polishing apparatus or a double-sided polishing apparatus may be used. In addition, when the rinse polishing step is performed after the CMP step, it is more efficient and preferable to perform the cleaning treatment using the same apparatus as the polishing apparatus used in the rinse polishing step.

The cleaning brush is not particularly limited, and preferably a resin brush is used. A material of the resin brush is not particularly limited, and, for example, it is preferable to use PVA (polyvinyl alcohol). And, it is particularly preferable to use a PVA-made sponge as the cleaning brush.

Cleaning conditions are also not particularly limited, and can be appropriately determined according to a type of the object to be subjected to surface treatment (object to be cleaned), and a type and an amount of the residues to be removed. For example, the rotation number of the cleaning brush is preferably 10 rpm or more and 200 rpm or less, and the rotation number of the object to be cleaned is preferably 10 rpm or more and 100 rpm or less. A method for supplying the rinse polishing composition to the polishing pad is not also particularly limited, and for example, a method for continuously supplying (flowing) the composition for surface treatment by a pump or the like is employed. A supply amount thereof is not limited, and it is preferred that the surface of the cleaning brush and the object to be cleaned be always covered with the composition for surface treatment, and the supply amount is preferably 10 mL/min or more and 5000 mL/min or less. The cleaning time is also not particularly limited, but a step using the composition for surface treatment according to an embodiment of the present invention is preferably 5 seconds or more and 180 seconds or less. With such a range, it is possible to remove foreign matters more effectively.

A temperature of the composition for surface treatment at the time of cleaning is not particularly limited, and may usually be room temperature, but may be heated to about 40° C. or more and 70° C. or less, as long as the performance is not impaired.

In the method (ii) above, the conditions of the cleaning method by immersion are not particularly limited, and known methods can be used.

Cleaning with water may be performed before performing surface treatment by the method (I) or (II).

(Post-Cleaning Treatment)

In addition, as the surface treatment method, it is preferable to additionally perform cleaning treatment on the polished object to be polished after the surface treatment of (I) or (II) using the composition for surface treatment according to an embodiment of the present invention. In the present specification, this cleaning treatment is referred to as post-cleaning treatment. The post-cleaning treatment is not particularly limited, and examples thereof include a method of simply flowing water to the object to be subjected to surface treatment, a method of simply immersing the object to be subjected to surface treatment in water, and the like. Further, as with the surface treatment by the method (II) described above, examples include a method of bringing a cleaning brush into contact with a single side or double sides of an object to be subjected to surface treatment while the object to be subjected to surface treatment being held, and the surface of the object to be subjected to surface treatment being rubbed with the cleaning brush while water is supplied to the contact portion, a method (dip-type) of immersing the object to be subjected to surface treatment in water, and performing ultrasonic treatment or stirring, and the like. Among them, the method of bringing the cleaning brush into contact with a single side or double sides of an object to be subjected to surface treatment while the object to be subjected to surface treatment being held, and the surface of the object to be subjected to surface treatment being rubbed with the cleaning brush while water is supplied to the contact portion is preferable. In addition, as the apparatus and conditions for post-cleaning treatment, the description of the surface treatment of (II) described above can be referred to. Here, it is particularly preferable to use deionized water as water used in post-cleaning treatment.

By surface treating with the composition for surface treatment according to an embodiment of the present invention, the residues become very easily removable. Therefore, by surface treating with the composition for surface treatment according to an embodiment of the present invention, and then performing further cleaning treatment using water, the residues will be very favorably removed.

Further, it is preferred that the polished object to be polished after surface treatment or after post-cleaning (object to be subjected to surface treatment) be dried by removing water droplets attached to the surface by a spin dryer or the like. Furthermore, the surface of the object to be subjected to surface treatment may be dried by air blow drying.

<Method for Producing Semiconductor Substrate>

The surface treatment method according to an embodiment of the present invention is suitably applied when the polished object to be polished is a polished semiconductor substrate. That is, according to another embodiment of the present invention, also provided is a method for producing a semiconductor substrate, in which a polished object to be polished is a polished semiconductor substrate, including reducing residues on the surface of the polished semiconductor substrate by the above surface treatment method, in the polished semiconductor substrate.

The details of the semiconductor substrate to which this production method is applied are as the description of the polished object to be polished surface treated with the composition for surface treatment.

In addition, the method for producing a semiconductor substrate is not particularly limited as long as it includes a step of surface treating (surface treatment step) the surface of a polished semiconductor substrate using the composition for surface treatment according to an embodiment of the present invention. Examples of the production method include a method having a polishing step and a cleaning step for forming a polished semiconductor substrate. Moreover, another example includes a method having, in addition to the polishing step and the cleaning step, a rinse polishing step between the polishing step and the cleaning step. Hereinafter, each of these steps will be described.

[Polishing Step]

The polishing step that can be included in the method for producing a semiconductor substrate is a step of polishing a semiconductor substrate to form a polished semiconductor substrate.

The polishing step is not particularly limited as long as it is a step for polishing a semiconductor substrate, and is preferably a chemical mechanical polishing (CMP) step. Also, the polishing step may be a polishing step consisting of a single step or a polishing step consisting of a plurality of steps. Examples of the polishing step consisting of a plurality of steps include a step of performing a finish polishing step after a preliminary polishing step (coarse polishing step), a step of performing one or more secondary polishing steps after a primary polishing step, and then performing a finish polishing step, and the like. The surface treatment step using the composition for surface treatment according to the present invention is preferably performed after the finish polishing step.

As the polishing composition, a known polishing composition can be appropriately used, depending on characteristics of the semiconductor substrate. The polishing composition is not particularly limited, and, for example, one containing an abrasive grain, a dispersing medium, and an acid or the like can be preferably used. Specific examples of the polishing composition include polishing compositions containing sulfonic acid-modified colloidal silica, water and maleic acid, and the like.

As the polishing apparatus, a general polishing apparatus in which a holder for holding an object to be polished and a motor capable of changing rotation number or the like, are mounted, and a polishing table capable of attaching a polishing pad (polishing cloth) is provided, can be used. As a polishing apparatus, either a single-sided polishing apparatus or a double-sided polishing apparatus may be used.

As the polishing pad, a general nonwoven fabric, polyurethane, and a porous fluororesin and the like can be used without particular limitation. The polishing pad is preferably grooved such that a polishing liquid is stored therein.

There is also no particular limitation on polishing conditions, for example, the rotation number of the polishing table, and the rotation number of the head (carrier) are each preferably 10 rpm or more and 100 rpm or less, and the pressure (polishing pressure) applied to the object to be polished is preferably 0.5 psi or more and 10 psi or less. A method for supplying the polishing composition to the polishing pad is not also particularly limited, and for example, a method for continuously supplying (flowing) the polishing composition by a pump or the like is employed. A supply amount thereof is not limited, and it is preferred that the surface of the polishing pad be always covered with the polishing composition, and the supply amount is preferably 10 mL/min or more and 5000 mL/min or less. The polishing time is also not particularly limited, but a step using the polishing composition is preferably 5 seconds or more and 180 seconds or less.

[Surface Treatment Step]

A surface treatment step refers to a step of reducing residues on the surface of a polished object to be polished using the composition for surface treatment according to an embodiment of the present invention. In the method for producing a semiconductor substrate, after the rinse polishing step, a cleaning step as a surface treatment step may be performed, or only the rinse polishing step or only the cleaning step may be performed.

(Rinse Polishing Step)

The rinse polishing step may be provided between the polishing step and the cleaning step in the method for producing a semiconductor substrate. The rinse polishing step is a step of reducing foreign matters on the surface of the polished object to be polished (polished semiconductor substrate) by the surface treatment method (rinse polishing treatment method) according to an embodiment of the present invention.

With regard to the apparatus such as the polishing apparatus and the polishing pad, and the polishing conditions, the same apparatus and conditions as the polishing step can be applied, except for supplying the composition for surface treatment according to an embodiment of the present invention, instead of supplying the polishing composition.

The details of the rinse polishing method used in the rinse polishing step are as described in the description of the rinse polishing treatment.

(Cleaning Step)

The cleaning step may be provided after the polishing step or may be provided after the rinse polishing step, in the method for producing a semiconductor substrate. The cleaning step is a step of reducing foreign matters on the surface of the polished object to be polished (polished semiconductor substrate) by the surface treatment method (cleaning method) according to an embodiment of the present invention.

The details of the cleaning method used in the cleaning step are as described in the description of the cleaning treatment.

[Post-Cleaning Step]

The method for producing a semiconductor substrate according to an embodiment of the present invention may provide a post-cleaning step. The details of the post-cleaning method used in the post-cleaning step are as described in the description of the post-cleaning treatment.

EXAMPLES

The present invention will be described in more detail with the following examples and comparative examples. However, the technical scope of the present invention is not limited only to the following examples. In addition, unless otherwise stated, "%" and "parts" mean "% by mass" and "parts by mass", respectively.

Comparative Example 1

[Preparation of Composition for Surface Treatment a-1]

0.5 parts by mass of an aqueous maleic acid solution having a solid content concentration of 30% by mass as an organic acid was added (the addition amount of maleic acid was 0.15 parts by mass), 0.25 parts by mass of an acrylic acid-acrylamide t-butylsulfonic acid copolymer (a copolymer of acrylic acid and acrylamide t-butylsulfonic acid, weight average molecular weight 7,000, ionic functional group (acid functional group: sulfonic acid (salt) group) density 10%, pKa 2 to 3, referred to as a copolymer WA in the following Table 1) as an ionic functional group-containing polymer (acid functional group-containing polymer P) was added, further, the remaining part of water (deionized water) was added so that the total of the composition was 100 parts by mass, and the ingredients were stirred and mixed to prepare composition for surface treatment a-1. When the pH value of the obtained composition for surface treatment a-1 (liquid temperature: 25° C.) was confirmed with a pH meter (manufactured by HORIBA, Ltd., model number: LAQUA (registered trademark)), it was found to be 2.1.

Examples 1 to 4

[Preparation of Compositions for Surface Treatment A-1 to A-4]

Each composition for surface treatment was prepared in the same manner as the preparation of the composition for surface treatment a-1 except that the ionic functional group-containing polymer was changed to the types shown below:

Used for composition for surface treatment A-1: a sodium salt of an acrylic acid-acrylamide t-butylsulfonic acid copolymer, weight average molecular weight 10,000, ionic functional group (acid functional group: sulfonic acid (salt) group) density 40%, pKa 0 to 1, referred to as copolymer WB in Table 1 below Used for composition for surface treatment A-2: an acrylic acid-acrylamide t-butylsulfonic acid copolymer, weight average molecular weight 9,000, ionic functional group (acid functional group: sulfonic acid (salt) group) density 60%, pKa 0 to 1, referred to as copolymer WC in Table 1 below Used for composition for surface treatment A-3: an acrylic acid-acrylamide t-butylsulfonic acid copolymer, weight average molecular weight 10,000, ionic functional group (acid functional group: sulfonic acid (salt) group) density 40%, pKa 0 to 1, referred to as copolymer WD in Table 1 below Used for composition for surface treatment A-4: an acrylamide t-butylsulfonic acid homopolymer, weight average molecular weight 9,000, ionic functional group (acid functional group: sulfonic acid (salt) group) density 100%, pKa<0, referred to as polymer DE in Table 1 below.

Comparative Examples 2 to 3

[Preparation of Composition for Surface Treatment b-1]

Into water (deionized water) were added a maleic acid aqueous solution having a solid content concentration of 30% by mass as an organic acid so as to be an addition amount of 0.55% by mass in the composition (the addition amount of maleic acid was 0.165% by mass in the composition), and polyvinyl alcohol (weight average molecular weight 15,000, degree of saponification 99%) as a wetting agent so as to be an addition amount of 0.1% by mass in the composition), and the ingredients were stirred and mixed to prepare composition for surface treatment b-1. When the pH value of the obtained composition for surface treatment b-1 (liquid temperature: 25° C.) was confirmed with a pH meter (manufactured by HORIBA, Ltd., model number: LAQUA (registered trademark)), it was found to be 2.1.

Examples 5 to 8

[Preparation of Compositions for Surface Treatment B-1 to B-4]

Each of the compositions for surface treatment was prepared in the same manner as the preparation of the composition for surface treatment b-1, except that, before stirring and mixing, polystyrene sulfonic acid (weight average molecular weight 10,000, ionic functional group (acid functional group: sulfonic acid (salt) group) density 100%, pKa=1.0) was further added into water (deionized water) as an ionic functional group-containing polymer so as to be an addition amount in the composition shown in Table 2 below.

Examples 9 to 12 and 13 to 15

[Preparation of Compositions for Surface Treatment B-5 to B-8]

Each of the compositions for surface treatment was prepared in the same manner as the preparation of the composition for surface treatment B-1, except that polyvinyl alcohol which is the wetting agent was changed to a sulfonic acid (salt) group-containing polyvinyl alcohol (weight average molecular weight 10,000, ionic functional group density 6%, pKa=1.0) which is an ionic functional group-containing polymer, in an addition amount in the composition shown in Table 2 below.

Here, as the sulfonic acid (salt) group-containing polyvinyl alcohol, a copolymer containing a constituent unit having a sulfonic acid (salt) group and a constituent unit derived from polyvinyl alcohol as constituent units, represented by the following formula, was used. Here, in the copolymer, the ratio of the number of constituent units derived from monomers having a sulfonic acid (salt) group to the number of constituent units derived from all monomers constituting the polymer compound was 6%, and the degree of saponification was 99.9%. The sulfonic acid (salt) group was a sodium salt form.

[Chemical Formula 3]

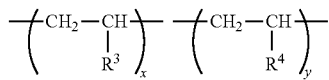

$R^3 = SO_3Na$ $R^4 = OH$ or $OCOCH_3$ x:y = 6 mol %: 94 mol % (total 100 mol %)

[Measurement of Weight Average Molecular Weight]

The weight average molecular weight of each acrylic acid-acrylamide t-butylsulfonic acid copolymer, acrylamide t-butylsulfonic acid homopolymer, polystyrene sulfonic acid, and sulfonic acid (salt) group-containing polyvinyl alcohol used values of weight average molecular weight (polyethylene glycol equivalent) determined by gel permeation chromatography (GPC). The weight average molecular weight was measured by the following apparatus and conditions:

GPC apparatus: manufactured by SHIMADZU CORPORATION
Model: Prominence+ELSD detector (ELSD-LTII)
Column: VP-ODS (manufactured by SHIMADZU CORPORATION)
Mobile phase A: MeOH
B: 1% aqueous solution of acetic acid
Flow rate: 1 mL/min
Detector: ELSD temp. 40° C., Gain 8, $N_2GAS$ 350 kPa
Oven temperature: 40° C.
Injection amount: 40 μL.

Further, the weight average molecular weight (Mw) of polyvinyl alcohol used as the wetting agent is a value obtained under the following conditions, according to a known gel permeation chromatography (GPC) measurement method when determining the weight average molecular weight of polyvinyl alcohol:

Column: Shodex (registered trademark) OHpak SB-806 HQ+SB-803 HQ (8.0 mm I.D.×300 mm each) (manufactured by Showa Denko K.K.)

Mobile phase: 0.1 M NaCl aqueous solution
Flow rate: 1.0 mL/min
Detector: Shodex (registered trademark) RI (manufactured by Showa Denko K.K.)
Column temperature: 40° C.

<Preparation of Object to be Subjected to Surface Treatment>

A polished silicon nitride substrate and a polished polysilicon substrate after being polished by the following chemical mechanical polishing (CMP) step were prepared as a polished object to be polished (also referred to as an object to be subjected to surface treatment).

[CMP Step]

For a silicon nitride substrate and a polysilicon substrate which are semiconductor substrates, polishing was each performed under the following conditions, using polishing composition M (composition; 4% by mass of sulfonic acid-functionalized colloidal silica (prepared by the method described in "Sulfonicacid-functionalized silica through quantitative oxidation of thiol groups", Chem. Commun. 246-247 (2003), average primary particle size 30 nm, average secondary particle size 60 nm), 0.018% by mass of an aqueous solution of maleic acid in a concentration of 30% by mass, solvent: water). Here, a 300 mm wafer was used as the silicon nitride substrate and the polysilicon substrate, respectively.

(Polishing Apparatus and Polishing Conditions)
Polishing apparatus: FREX 300E manufactured by Ebara Corporation
Polishing pad: Hard polyurethane pad IC1400 manufactured by Nitta Haas Incorporated
Polishing pressure: 2.0 psi (1 psi=6894.76 Pa, the same applies hereafter)
Rotation number of polishing table: 60 rpm
Rotation number of head: 60 rpm
Supply of polishing composition: flowing
Polishing composition supply amount: 300 mL/min
Polishing time: 60 seconds.

[Cleaning Step (Surface Treatment Step)]

After the silicon nitride substrate was polished by the CMP step, the silicon nitride substrate was separated from the polishing table (platen). Subsequently, the polished object to be polished was cleaned by a cleaning method of rubbing the polished object to be polished (polished silicon nitride substrate) under the following conditions, using the compositions for surface treatment a-1 and A-1 to A-4 prepared above in the same polishing apparatus, while pressure was applied with a polyvinyl alcohol (PVA) sponge which is a cleaning brush:

(Cleaning Apparatus and Cleaning Conditions)
Apparatus: FREX 300E manufactured by Ebara Corporation
Rotation number of cleaning brush: 100 rpm
Rotation number of object to be cleaned (polished object to be polished): 100 rpm
Flow rate of cleaning solution: 1000 mL/min
Cleaning time: 30 seconds.

[Rinse Polishing Step (Surface Treatment Step)]

After the silicon nitride substrate and the polysilicon substrate were each polished by the CMP step, the polished silicon nitride substrate and the polished polysilicon substrate were separated from the polishing table (platen). Subsequently, using the compositions for surface treatments b-1 and B-1 to B-8 prepared above, the polished silicon nitride substrate and the polished polysilicon substrate were mounted again on the polishing table (platen), and the rinse polishing treatment was performed under the following conditions.

Polishing apparatus: FREX 300E manufactured by Ebara Corporation
Polishing pad: Hard polyurethane pad IC1400 manufactured by Nitta Haas Incorporated
Polishing pressure: 1.0 psi
Rotation number of polishing table: 60 rpm
Rotation number of head: 60 rpm
Type of polishing composition: compositions for surface treatment b-1 and B-1 to B-8
Supply of polishing composition: flowing
Polishing composition supply amount: 200 mL/min
Polishing time: 60 seconds.

[Post-Cleaning Treatment Step]

After the rinse polishing treatment, while the composition for surface treatment was applied to the polished silicon nitride substrate and the polished polysilicon substrate after being polished in the rinse polishing step, the polished silicon nitride substrate and the polished polysilicon substrate were each pulled up and taken out. Subsequently, with respect to the polished silicon nitride substrate and the polished polysilicon substrate after being polished in the rinse polishing step, each polished object to be polished was cleaned by a cleaning method of rubbing each polished object to be polished under the following conditions while pressure was applied with a polyvinyl alcohol (PVA) sponge which is a cleaning brush, using water (deionized water).

Apparatus: FREX 300E manufactured by Ebara Corporation
Rotation number of cleaning brush: 100 rpm
Rotation number of polished object to be polished: 50 rpm
Type of cleaning composition: water (deionized water)
Cleaning composition supply amount: 1000 mL/min
Cleaning time: 60 seconds.

<Evaluation>

The following items were measured and evaluated for each polished object to be polished after being surface treated by the cleaning step or the rinse polishing step and the post-cleaning step.

[Evaluation of Total Number of Residues]

The number of foreign matters (total number of residues) of 0.09 µm or more was measured after cleaning the polished object to be polished under the cleaning conditions shown above or the rinse polishing step and post-cleaning step, using each composition for surface treatment. A wafer defect inspection system SP-2 manufactured by KLA TENCOR was used to measure the number of foreign matters. The measurement was performed on the remaining portion excluding a portion of 5 mm in width from an outer peripheral end portion of a single side of the cleaned substrate (a portion from 0 mm to 5 mm in width when the outer peripheral end portion was set to 0 mm).

[Evaluation of Number of Organic Residues]

Further, using the compositions for surface treatment a-1 and A-1 to A-4, the number of organic residues after the polished object to be polished (polished silicon nitride substrate) was cleaned under the cleaning conditions shown above was measured by SEM observation using Review SEM RS6000 manufactured by Hitachi, Ltd. First, by SEM observation, 100 foreign matters existing in the remaining portion excluding the portion of 5 mm in width from the outer peripheral end portion of the single side of the polished object to be polished (a portion from 0 mm to 5 mm in width when the outer peripheral end portion was set to 0 mm) were sampled. Subsequently, the organic residues were visually determined by SEM observation from the sampled 100 foreign matters, and the number of the organic residues was confirmed to calculate the ratio (%) of the organic residues in the foreign matters. Then, the product of the number (pieces) of foreign matters of 0.09 μm or more measured using SP-2 manufactured by KLA TENCOR in the above-mentioned evaluation of the number of foreign matters and the ratio (%) of the organic residues in the foreign matters calculated from the SEM observation result was calculated as the number (pieces) of organic residues.

[Amount of Adsorption to Pad Debris]

The amount of adsorption of the ionic functional group-containing polymer contained in Comparative Example 1, Example 1 and Example 2 to pad debris was measured.

Specifically, a diamond pad conditioner A165 manufactured by 3M was attached to FREX 300E (manufactured by Ebara Corporation) which is a polishing apparatus, and IC1400 (manufactured by Nitta Haas Incorporated, hard polyurethane pad) which is a polishing pad was conditioned at 5 lbf (34.47 kPa) while deionized water is supplied, and the collected waste liquid was used as a pad debris dispersion. A predetermined amount of the ionic functional group-containing polymer was added to the pad debris dispersion to start an adsorption reaction, and it was sampled after a lapse of 60 seconds. The sampled matter was filtered, and with respect to the pad debris dispersion and the filtered aqueous solution, the total carbon concentration was measured with a TOC meter (total organic carbon meter) manufactured by SHIMADZU CORPORATION, and a difference obtained by subtracting the measured values of the pad debris dispersion from the measured value of the filtered aqueous solution was defined as the amount of adsorption of the ionic functional group-containing polymer to the pad debris.

The constitution of the compositions for surface treatment a-1 and A-1 to A-4, and the evaluation results of the number of organic residues and the amount of adsorption to the pad debris are shown in Table 1 below.

Further, the constitution of the compositions for surface treatment b-1 and B-1 to B-8 and the evaluation results of the total number of residues are shown in Tables 2 and 3 below.

TABLE 1

| | | Ionic functional group-containing polymer | | | | | Evaluation result | | |
|---|---|---|---|---|---|---|---|---|---|
| | Composition No. | Type | Molecular weight | Ionic functional group density (%) | pKa | Concentration (g/kg) | pH of Composition | Amount of adsorption to pad debris (mg/L) | Total number of residues (number of foreign matters) (pieces) | Number of organic residues (pieces) |
| Comparative Example 1 | a-1 | Copolymer WA | 7,000 | 10 | 2 to 3 | 2.5 | 2.1 | 206 | 10236 | 7022 |
| Example 1 | A-1 | Copolymer WB | 10,000 | 40 | 0 to 1 | 2.5 | 2.1 | 263 | 889 | 450 |
| Example 2 | A-2 | Copolymer WC | 9,000 | 60 | 0 to 1 | 2.5 | 2.1 | 282 | 168 | 84 |
| Example 3 | A-3 | Copolymer WD | 10,000 | 40 | 0 to 1 | 2.5 | 2.0 | — | 210 | 121 |
| Example 4 | A-4 | Polymer DE | 9,000 | 100 | <0 | 2.5 | 2.0 | — | 76 | 30 |

TABLE 2

| | | Ionic functional group-containing compound | | | | | Other polymer compound(s) | | | | Evaluation result of polysilicon substrate |
|---|---|---|---|---|---|---|---|---|---|---|---|
| | Composition No | Type | Molecular weight | pKa | Ionic functional group density (%) | Concentration (% by mass) | Type | Molecular weight | Concentration (% by mass) | pH of Composition | Total number of residues (piece) |
| Comparative Example 2 | b-1 | None | | | | | Polyvinyl alcohol | 15,000 | 0.1 | 2.1 | 294998 |
| Example 5 | B-1 | Polystyrene sulfonic acid | 10,000 | 1.0 | 100 | 0.1 | Polyvinyl alcohol | 15,000 | 0.1 | 2.1 | 5694 |
| Example 6 | B-2 | Polystyrene sulfonic acid | 10,000 | 1.0 | 100 | 0.5 | Polyvinyl alcohol | 15,000 | 0.1 | 2.1 | 4020 |
| Example 7 | B-3 | Polystyrene sulfonic acid | 10,000 | 1.0 | 100 | 1 | Polyvinyl alcohol | 15,000 | 0.1 | 2.1 | 5266 |
| Example 8 | B-4 | Polystyrene sulfonic acid | 10,000 | 1.0 | 100 | 5 | Polyvinyl alcohol | 15,000 | 0.1 | 2.1 | 2696 |
| Example 9 | B-5 | Polystyrene sulfonic acid | 10,000 | 1.0 | 100 | 0.1 | None | | | 2.1 | 6291 |
| | | Sulfonic acid (salt) group-containing polyvinyl alcohol | 10,000 | 1.0 | 6 | 0.1 | | | | | |
| Example 10 | B-6 | Polystyrene sulfonic acid | 10,000 | 1.0 | 100 | 0.5 | None | | | 2.1 | 1873 |

TABLE 2-continued

| | Composition No | Ionic functional group-containing compound | | | | | Other polymer compound(s) | | | pH of Composition | Evaluation result of polysilicon substrate |
|---|---|---|---|---|---|---|---|---|---|---|---|
| | | Type | Molecular weight | pKa | Ionic functional group density (%) | Concentration (% by mass) | Type | Molecular weight | Concentration (% by mass) | | Total number of residues (piece) |
| Example 11 | B-7 | Sulfonic acid (salt) group-containing polyvinyl alcohol | 10,000 | 1.0 | 6 | 0.1 | None | | | 2.1 | 2073 |
| | | Polystyrene sulfonic acid | 10,000 | 1.0 | 100 | 1 | | | | | |
| | | Sulfonic acid (salt) group-containing polyvinyl alcohol | 10,000 | 1.0 | 6 | 0.1 | | | | | |
| Example 12 | B-8 | Polystyrene sulfonic acid | 10,000 | 1.0 | 100 | 2.5 | None | | | 2.1 | 2333 |
| | | Sulfonic acid (salt) group-containing polyvinyl alcohol | 10,000 | 1.0 | 6 | 0.1 | | | | | |

TABLE 3

| | Compound No. | Ionic functional group-containing compound | | | | | Other polymer compound | | | pH of Composition | Evaluation result of SiN substrate |
|---|---|---|---|---|---|---|---|---|---|---|---|
| | | Type | Molecular weight | pKa | Ionic functional group density (%) | Concentration (% by mass) | Type | Molecular weight | Concentration (% by mass) | | Total number of residues (piece) |
| Comparative Example 3 | b-1 | None | | | | | Polyvinyl alcohol | 10,000 | 0.1 | 2.1 | 259 |
| Example 13 | B-6 | Polystyrene sulfonic acid | 10,000 | 1.0 | 100 | 0.5 | None | | | 2.1 | 143 |
| | | Sulfonic acid (salt) group-containing polyvinyl alcohol | 10,000 | 1.0 | 6 | 0.1 | | | | | |
| Example 14 | B-7 | Polystyrene sulfonic acid | 10,000 | 1.0 | 100 | 1 | None | | | 2.1 | 191 |
| | | Sulfonic acid (salt) group-containing polyvinyl alcohol | 10,000 | 1.0 | 6 | 0.1 | | | | | |
| Example 15 | B-8 | Polystyrene sulfonic acid | 10,000 | 1.0 | 100 | 2.5 | None | | | 2.1 | 247 |
| | | Sulfonic acid (salt) group-containing polyvinyl alcohol | 10,000 | 1.0 | 6 | 0.1 | | | | | |

As is apparent from Table 1 above, it was found that the compositions for surface treatment of examples can significantly reduce the number of organic residues on the surface of the polished object to be polished. Moreover, from the comparison of the measurement data of the amount of adsorption to the pad debris among Comparative Example 1 and Examples 1 and 2, it was suggested that the ionic functional group-containing polymer contained in the compositions for surface treatment of examples is well adsorbed to the pad debris, and a performance for removing pad debris during the surface treatment step is high.

Further, as is apparent from Table 2 and Table 3 above, it was found that the composition for surface treatment of examples can significantly reduce the total number of residues on the surface of the polished object to be polished.

The present application is based on Japanese patent application No. 2017-42112 filed on Mar. 6, 2017 and Japanese patent application No. 2017-185150 filed on Sep. 26, 2017, and a disclosure content thereof is incorporated herein as a whole by reference.

The invention claimed is:

1. A composition for surface treatment comprising:
   a polymer compound having at least one ionic functional group selected from the group consisting of a sulfonic acid (salt) group, a phosphoric acid (salt) group, and a phosphonic acid (salt) group; and
   water, wherein;
   when the ionic functional group is the sulfonic acid salt group, the sulfonic acid salt group is at least one selected from the group consisting of a sulfonic acid alkali metal salt and a sulfonic acid salt of a group bold 2 element;
   when the ionic functional group is the phosphoric acid salt group, the phosphoric acid salt group is a phosphoric acid metal salt; and when the ionic functional group is the phosphonic acid salt group, the phosphonic acid salt group is at least one selected from the group consisting of a phosphonic acid alkali metal salt and a phosphonic acid salt of a group 2 element, a pH of the composition is less than 7, and the polymer compound has a pKa of 3 or less and an ionic functional group density of more than 10%, wherein the ionic functional group density is represented by the following formula (1):

Ionic functional group density (%)=100×(Number of constituent unit derived from monomer having ionic functional group/Number of constituent unit derived from all monomers constituting polymer compound)   Formula (1).

2. The composition for surface treatment according to claim 1, wherein the polymer compound comprises a copolymer comprising a constituent unit having a sulfonic acid (salt) group and another constituent unit.

3. The composition for surface treatment according to claim 2, wherein the other constituent unit comprises a constituent unit derived from an ethylenically unsaturated monomer.

4. The composition for surface treatment according to claim 1, wherein the polymer compound comprises a homopolymer consisting of only a constituent unit having at least one acid functional group selected from the group consisting of a sulfonic acid (salt) group, a phosphoric acid (salt) group, and a phosphonic acid (salt) group.

5. The composition for surface treatment according to claim 1, wherein the polymer compound comprises a polymer compound having a sulfonic acid (salt) group.

6. The composition for surface treatment according to claim 5, wherein a polymer compound having the sulfonic acid (salt) group is at least one selected from the group consisting of a sulfonic acid (salt) group-containing polyvinyl alcohol, a sulfonic acid (salt) group-containing polystyrene, a sulfonic acid (salt) group-containing polyvinyl acetate, a sulfonic acid (salt) group-containing polyester, a copolymer of a (meth)acrylic group-containing monomer-a sulfonic acid (salt) group-containing monomer, a sulfonic acid (salt) group-containing polyisoprene, a sulfonic acid (salt)-containing allyl polymer, and salts thereof.

7. The composition for surface treatment according to claim 1, wherein the content of the polymer compound is 50% by mass or more based on the total mass of the polymer contained in the composition for surface treatment.

8. The composition for surface treatment according to claim 1, further comprising a wetting agent.

9. The composition for surface treatment according to claim 8, wherein the wetting agent is at least one selected from the group consisting of a copolymer comprising a constituent unit having at least one ionic functional group selected from the group consisting of a sulfonic acid (salt) group and an amino group, and another constituent unit, and having an ionic functional group density represented by the formula (1) of 10% or less, a copolymer comprising a constituent unit having at least one ionic functional group selected from the group consisting of a sulfonic acid (salt) group and an amino group, and another constituent unit, and having a pKa of more than 3, a copolymer comprising a constituent unit having a carboxylic acid (salt) group and another constituent unit, polyvinyl alcohol, and polyvinyl pyrrolidone.

10. The composition for surface treatment according to claim 1, wherein a pH value is 1 or more and less than 3.

11. The composition for surface treatment according to claim 1, which does not substantially comprise abrasive grains.

12. The composition for surface treatment according to claim 1, which is used to reduce residues on a surface of a polished object to be polished.

13. The composition for surface treatment according to claim 12, wherein the polished object to be polished comprises at least one selected from the group consisting of silicon nitride, silicon oxide and polysilicon.

14. The composition for surface treatment according to claim 12, wherein the residue is an organic residue.

15. A surface treatment method, comprising surface treating a polished object to be polished using the composition for surface treatment as defined in claim 1 to reduce organic residues on the surface of the polished object to be polished.

16. The surface treatment method according to claim 15, wherein the surface treatment is performed by a rinse polishing treatment or a cleaning treatment.

17. A method for producing the composition for surface treatment as defined in claim 1, comprising mixing the polymer compound and the water.

18. A method for producing a semiconductor substrate, wherein the polished object to be polished is a polished semiconductor substrate, comprising reducing organic residues on a surface of the polished semiconductor substrate, by the surface treatment method as defined in claim 15.

19. A composition for surface treatment comprising:
a polymer compound having at least one ionic functional group selected from the group consisting of a sulfonic acid (salt) group, a phosphoric acid (salt) group, a phosphonic acid (salt) group, and an amino group;
a wetting agent; and
water, wherein:
a pH of the composition is less than 7, and
the polymer compound has a pKa of 3 or less and an ionic functional group density of more than 10%,
wherein the ionic functional group density is represented by the following formula (1):

Ionic functional group density (%)=100×(Number of constituent unit derived from monomer having ionic functional group/Number of constituent unit derived from all monomers constituting polymer compound)   Formula (1); and wherein the wetting agent is a copolymer comprising a constituent unit having at least one ionic functional group selected from the group consisting of a sulfonic acid (salt) group and an amino group, and another constituent unit, and having an ionic functional group density represented by the formula (1) of 10% or less.

20. The composition for surface treatment according to claim 19, wherein the polymer compound has the ionic functional group density of 20% or more and 100% or less.

21. The composition for surface treatment according to claim 19, wherein the wetting agent has the ionic functional group density of 6% or less.

* * * * *